(12) United States Patent
Hsieh et al.

(10) Patent No.: US 12,476,107 B2
(45) Date of Patent: Nov. 18, 2025

(54) METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventors: Chieh-Hsin Hsieh, Hsinchu (TW); Wei-Han Lai, New Taipei (TW); Ching-Yu Chang, Yuansun Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 763 days.

(21) Appl. No.: 17/461,592

(22) Filed: Aug. 30, 2021

(65) Prior Publication Data

US 2023/0102166 A1 Mar. 30, 2023

(51) Int. Cl.
*H01L 21/02* (2006.01)
*G03F 7/16* (2006.01)
*H01L 21/027* (2006.01)
*B05D 1/00* (2006.01)

(52) U.S. Cl.
CPC ........ *H01L 21/02282* (2013.01); *G03F 7/162* (2013.01); *H01L 21/0276* (2013.01); *B05D 1/005* (2013.01)

(58) Field of Classification Search
CPC ........... H01L 21/02282; H01L 21/0276; H01L 21/32139; G03F 7/162; B05D 1/005
See application file for complete search history.

(56) References Cited

U.S. PATENT DOCUMENTS

| 8,796,666 | B1 | 8/2014 | Huang et al. | |
|---|---|---|---|---|
| 9,093,530 | B2 | 7/2015 | Huang et al. | |
| 9,213,234 | B2 | 12/2015 | Chang | |
| 9,223,220 | B2 | 12/2015 | Chang | |
| 9,256,133 | B2 | 2/2016 | Chang | |
| 9,536,759 | B2 | 1/2017 | Yang et al. | |
| 9,548,303 | B2 | 1/2017 | Lee et al. | |
| 9,857,684 | B2 | 1/2018 | Lin et al. | |
| 9,859,206 | B2 | 1/2018 | Yu et al. | |
| 9,875,892 | B2 | 1/2018 | Chang et al. | |
| 2003/0008518 | A1* | 1/2003 | Chang | H01L 21/3105 257/E21.256 |
| 2007/0161230 | A1* | 7/2007 | Chen | H01L 21/7682 438/789 |
| 2011/0269078 | A1* | 11/2011 | Rathsack | G03F 7/2004 430/324 |

(Continued)

OTHER PUBLICATIONS https://group.nagase.com/nagasechemtex/denacol/en/product/difunctional_type.html (Year: 2024).*

*Primary Examiner* — Jonathan Johnson
*Assistant Examiner* — Alexander N. Lee
(74) *Attorney, Agent, or Firm* — STUDEBAKER BRACKETT PLLC

(57) ABSTRACT

A method of manufacturing a semiconductor device includes forming a protective layer over a substrate. The hydrophilicity of the protective layer is reduced. A resist layer is formed over the protective layer, and the resist layer is patterned. The hydrophilicity of the protective layer can be reduced by applying an ethylene oxide, a propylene oxide or a combination of both to the protective layer.

20 Claims, 32 Drawing Sheets

(56) References Cited

U.S. PATENT DOCUMENTS

| | | | |
|---|---|---|---|
| 2013/0233827 A1* | 9/2013 | Yin | C08F 6/02 |
| | | | 524/562 |
| 2014/0273457 A1* | 9/2014 | Su | H01L 21/02359 |
| | | | 438/692 |
| 2017/0097566 A1* | 4/2017 | Elce | C08L 45/00 |
| 2017/0179305 A1* | 6/2017 | Cheng | H01L 29/40117 |
| 2017/0371247 A1* | 12/2017 | Haq | G03F 7/0382 |
| 2018/0337058 A1* | 11/2018 | Lai | H01L 21/3081 |
| 2020/0183282 A1* | 6/2020 | Hashimoto | C08F 220/06 |
| 2021/0057210 A1* | 2/2021 | Wojtczak | H01L 21/02057 |

\* cited by examiner

| 235 | 235 | 235 | 235 | 235 | 235 |
|---|---|---|---|---|---|
| 230 | 230 | 230 | 230 | 230 | 230 |
| 210 | 210 | 210 | 210 | 210 | 210 |
| N1 | N2 | N3 | P3 | P2 | P1 |

Fig. 20A

| 245 | 245 | 245 | 245 | 245 | 245 |
|---|---|---|---|---|---|
| 235 | 235 | 235 | 235 | 235 | 235 |
| 230 | 230 | 230 | 230 | 230 | 230 |
| 210 | 210 | 210 | 210 | 210 | 210 |
| N1 | N2 | N3 | P3 | P2 | P1 |

Fig. 20B

| 200 | 200 | 200 | 200 | 200 | 200 |
|---|---|---|---|---|---|
| 245 | 245 | 245 | 245 | 245 | 245 |
| 235 | 235 | 235 | 235 | 235 | 235 |
| 230 | 230 | 230 | 230 | 230 | 230 |
| 210 | 210 | 210 | 210 | 210 | 210 |
| N1 | N2 | N3 | P3 | P2 | P1 |

Fig. 20C

| 205 | 205 | 205 | 205 | 205 | 205 |
|---|---|---|---|---|---|
| 260 | 260 | 260 | 260 | 260 | 260 |
| 200 | 200 | 200 | 200 | 200 | 200 |
| 245 | 245 | 245 | 245 | 245 | 245 |
| 235 | 235 | 235 | 235 | 235 | 235 |
| 230 | 230 | 230 | 230 | 230 | 230 |
| 210 | 210 | 210 | 210 | 210 | 210 |
| N1 | N2 | N3 | P3 | P2 | P1 |

Fig. 20D

| 205 | 205 | 205 | | | |
|---|---|---|---|---|---|
| 260 | 260 | 260 | | | |
| 200 | 200 | 200 | 200 | 200 | 200 |
| 245 | 245 | 245 | 245 | 245 | 245 |
| 235 | 235 | 235 | 235 | 235 | 235 |
| 230 | 230 | 230 | 230 | 230 | 230 |
| 220 | 220 | 220 | 220 | 220 | 220 |
| N1 | N2 | N3 | P3 | P2 | P1 |

Fig. 20E

| 205 | 205 | 205 | | | |
|---|---|---|---|---|---|
| 260 | 260 | 260 | | | |
| 200 | 200 | 200 | | | |
| 245 | 245 | 245 | 245 | 245 | 245 |
| 235 | 235 | 235 | 235 | 235 | 235 |
| 230 | 230 | 230 | 230 | 230 | 230 |
| 220 | 220 | 220 | 220 | 220 | 220 |
| N1 | N2 | N3 | P3 | P2 | P1 |

Fig. 20F

| 200 | 200 | 200 | | | |
|---|---|---|---|---|---|
| 245 | 245 | 245 | 245 | 245 | 245 |
| 235 | 235 | 235 | 235 | 235 | 235 |
| 230 | 230 | 230 | 230 | 230 | 230 |
| 220 | 220 | 220 | 220 | 220 | 220 |
| N1 | N2 | N3 | P3 | P2 | P1 |

Fig. 20G

| 250 | 250 | 250 | | | |
|---|---|---|---|---|---|
| 200 | 200 | 200 | | | |
| | | | 250 | 250 | 250 |
| 245 | 245 | 245 | 245 | 245 | 245 |
| 235 | 235 | 235 | 235 | 235 | 235 |
| 230 | 230 | 230 | 230 | 230 | 230 |
| 220 | 220 | 220 | 220 | 220 | 220 |
| N1 | N2 | N3 | P3 | P2 | P1 |

Fig. 20H

| 280 | 280 | 280 |  |  |  |
|---|---|---|---|---|---|
| 250 | 250 | 250 |  |  |  |
| 200 | 200 | 200 | 280 | 280 | 280 |
|  |  |  | 250 | 250 | 250 |
| 245 | 245 | 245 | 245 | 245 | 245 |
| 235 | 235 | 235 | 235 | 235 | 235 |
| 230 | 230 | 230 | 230 | 230 | 230 |
| 210 | 210 | 210 | 210 | 210 | 210 |
| N1 | N2 | N3 | P3 | P2 | P1 |

Fig. 20I

| 215 | 215 | 215 |  |  |  |
|---|---|---|---|---|---|
| 265 | 265 | 265 | 215 | 215 | 215 |
|  |  |  | 265 | 265 | 265 |
| 280 | 280 | 280 |  |  |  |
| 250 | 250 | 250 |  |  |  |
| 200 | 200 | 200 | 280 | 280 | 280 |
|  |  |  | 250 | 250 | 250 |
| 245 | 245 | 245 | 245 | 245 | 245 |
| 235 | 235 | 235 | 235 | 235 | 235 |
| 230 | 230 | 230 | 230 | 230 | 230 |
| 210 | 210 | 210 | 210 | 210 | 210 |
| N1 | N2 | N3 | P3 | P2 | P1 |

METHOD OF MANUFACTURING A SEMICONDUCTOR DEVICE

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 20A, 20B, 20C, 20D, 20E, 20F, 20G, 20H, 20I, 20J, 20K, 20L, 20M, 20N, 20O, 20P, 20Q, and 20R show a sequential operation according to embodiments of the disclosure.

DETAILED DESCRIPTION

Figure 1:
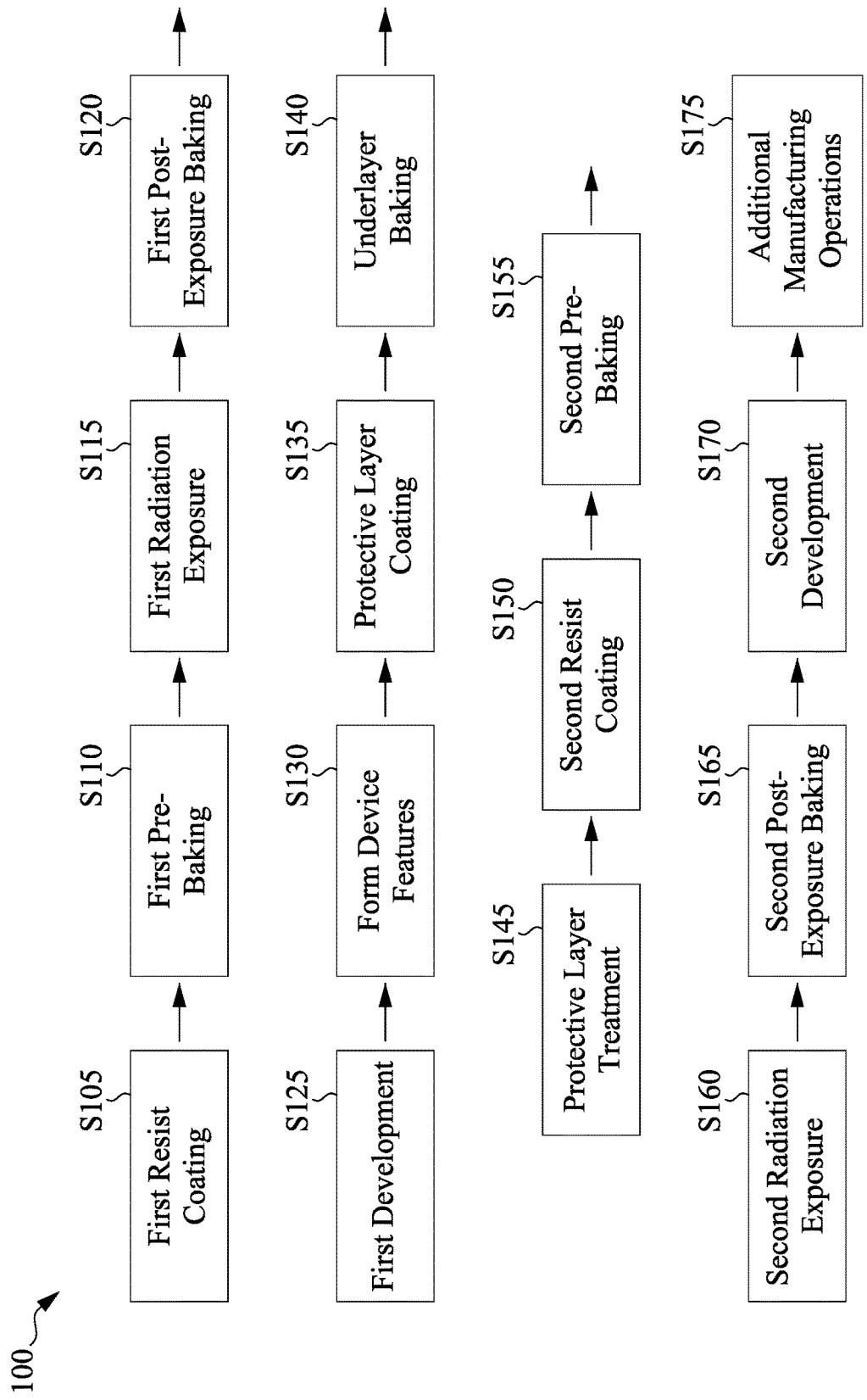
FIG. 1 illustrates a process flow of manufacturing a semiconductor device according to embodiments of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

As semiconductor device pattern features become smaller and the spacing between features shrinks, filling the gap between pattern features becomes more important. Metal gate technology using a replacement gate process is increasingly being used. The metal layers are formed in a narrow gate space, from which a dummy gate electrode is removed, and the gate replacement process uses one or more lithography, wet cleaning, and etching operations. A protective layer or photoresist underlayer, such as bottom anti-reflective coatings (BARC) or spin on carbon (SOC) coatings, is used to protect semiconductor device features, such as the metal gates, during wet processing operations, such as wet etching and wet cleaning. Complete filling of narrow gaps between semiconductor device pattern features is desired to prevent damage to the semiconductor device features during the wet processing operations. Poor wet cleaning and wet etching resistance of the protective layer or photoresist underlayer may cause film loss, penetration of the protective layer or underlayer by the wet chemicals, swelling of the protective layer or underlayer, and peeling of the protective layer or underlayer during the wet etching or wet cleaning process that may lead to damage to an underlying metal and yield loss. Embodiments of the present disclosure include methods and materials that provide improved gap filling, improved planarity of the protective layer or underlayer, increased resistance to wet cleaning and wet etching, reduced damage and defects, and improved semiconductor device yield.

Figure 2:
FIG. 2 shows a process stage of a sequential operation according to an embodiment of the disclosure.

FIG. 1 illustrates a process flow 100 of manufacturing a semiconductor device according to embodiments of the disclosure. A resist layer 15 is formed by coating a resist composition over a layer to be patterned or target layer 20 on a substrate 10 in operation S105, as shown in FIG. 2 in some embodiments. In some embodiments, the resist layer 15 is a photoresist layer 15. Then the resist layer 15 undergoes a first baking operation S110 (or pre-baking operation) to evaporate solvents in the resist composition in some embodiments. The resist layer 15 is baked at a temperature and time sufficient to cure and dry the resist layer 15. In some embodiments, the resist layer is heated at a temperature ranging from about 40° C. to about 120° C. for about 10 seconds to about 10 minutes.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

In some embodiments, the target layer 20 is a semiconductor layer, a metallization (conductive) layer, or a dielectric layer, such as a passivation layer or an interlayer dielectric layer, disposed over a metallization layer. In some embodiments, the target layer 20 is formed of a semiconductor material, such as silicon. In embodiments where the target layer 20 is a metallization layer, the target layer is formed of a conductive material using metallization processes, and metal deposition techniques, including chemical vapor deposition, atomic layer deposition, and physical vapor deposition (sputtering). Similarly, if the target layer 20 is a dielectric layer, the target layer 20 is formed by dielectric layer formation techniques, including thermal oxidation, chemical vapor deposition, atomic layer deposition, and physical vapor deposition. In some embodiments, the target layer 20 is a BARC layer.

In some embodiments, after the first (or pre-) baking operation S110 of the photoresist layer 15, the photoresist layer 15 is selectively exposed to actinic radiation 45 (see FIGS. 3A and 3B) in operation S115. In some embodiments, the photoresist layer 15 is selectively exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the actinic radiation is an electron beam.

Figure 3A:
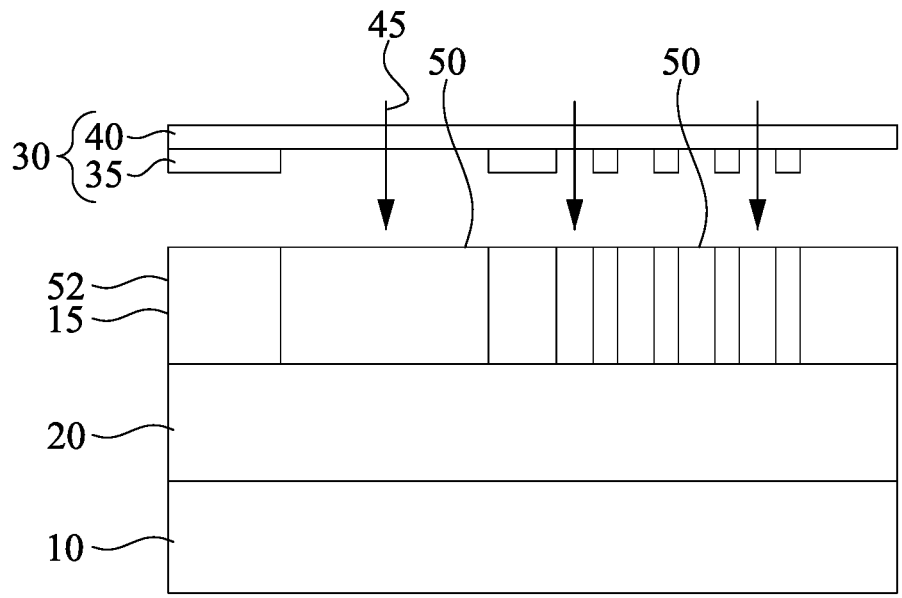
FIGS. 3A and 3B show a process stage of a sequential operation according to embodiments of the disclosure.
Figure 3B:
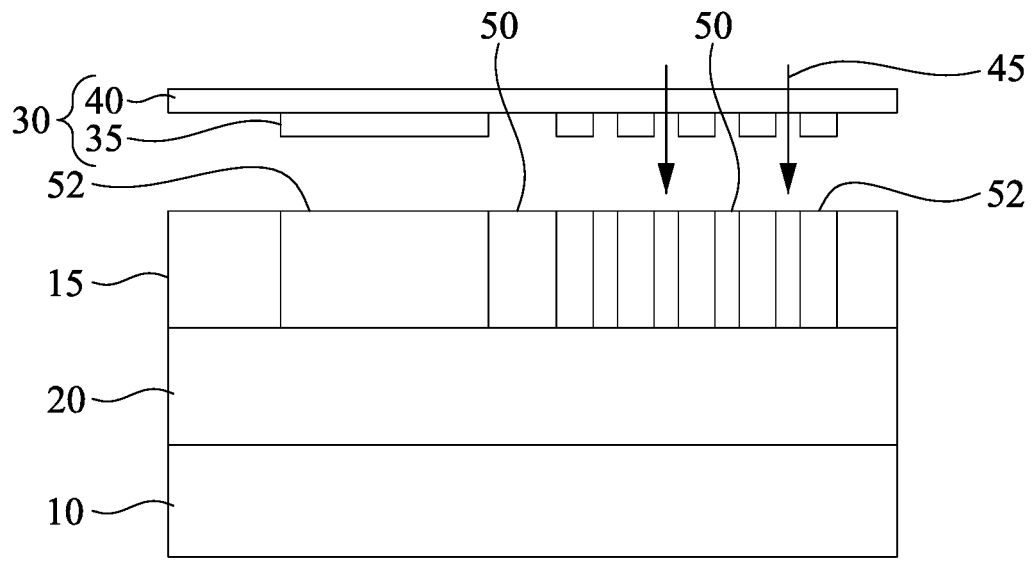

As shown in FIGS. 3A and 3B, the exposure radiation 45 passes through a photomask 30 before irradiating the photoresist layer 15 in some embodiments. In some embodiments, the photomask has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

The region 50 of the photoresist layer exposed to radiation 45 undergoes a chemical reaction thereby changing its solubility in a subsequently applied developer relative to the region of the photoresist layer not exposed to radiation 52. In some embodiments, the portion of the photoresist layer exposed to radiation 50 undergoes a crosslinking reaction. FIG. 3A illustrates selective exposure of a positive tone photoresist, and FIG. 3B illustrates selective exposure of a negative tone photoresist.

In some embodiments, the photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive tone resists or negative tone resists. A positive tone resist refers to a photoresist material that when exposed to radiation, such as UV light, becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Whether a resist is a positive tone or negative tone may depend on the type of developer used to develop the resist. For example, some positive tone photoresists provide a positive pattern, (i.e. the exposed regions are removed by the developer), when the developer is an aqueous-based developer, such as a tetramethylammonium hydroxide (TMAH) solution. On the other hand, the same photoresist provides a negative pattern (i.e. the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

In some embodiments, resist compositions according to embodiments of the disclosure, such as a photoresist, include a polymer or a polymerizable monomer or oligomer along with one or more photoactive compounds (PACs). In some embodiments, the concentration of the polymer, monomer, or oligomer ranges from about 1 wt. % to about 75 wt. % based on the total weight of the resist composition. In other embodiments, the concentration of the polymer, monomer, or oligomer ranges from about 5 wt. % to about 50 wt. %. At concentrations of the polymer, monomer, or oligomer below the disclosed ranges the polymer, monomer, or oligomer has negligible effect on the resist performance. At concentrations above the disclosed ranges, there is no substantial improvement in resist performance or there is degradation in the formation of consistent resist layers.

In some embodiments, the polymerizable monomer or oligomer includes an acrylic acid, an acrylate, a hydroxystyrene, or an alkylene. In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy) ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, hydroxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the polymer is a polyhydroxystyrene, a polymethyl methacrylate, or a polyhydroxystyrene-t-butyl acrylate, e.g.—

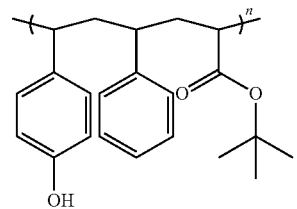

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decompose, otherwise known as a leaving group or, in some embodiments in which the PAC is a photoacid generator, an acid labile group, is attached to the hydrocarbon structure so that, it will react with the acids/bases/free radicals generated by the PACs during exposure. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl) methylene group, an (alkylsulfonyl)(alkyl-carbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiments, the polymer also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer includes groups that can assist in increasing the adhesiveness of the photoresist layer 15 to underlying structures (e.g., target layer 20). Polar groups may be used to help increase the adhesiveness. Suitable polar groups include hydroxyl groups, cyano groups, or the like, although any suitable polar group may, alternatively, be used.

Optionally, the polymer includes one or more alicyclic hydrocarbon structures that do not also contain a group, which will decompose in some embodiments. In some embodiments, the hydrocarbon structure that does not contain a group which will decompose includes structures such as 1-adamantyl(meth)acrylate, tricyclodecanyl (meth)acrylate, cyclohexyl (methacrylate), combinations of these, or the like.

In some embodiments, such as when EUV radiation is used, the photoresist compositions according to the present disclosure are metal-containing resists. The metal-containing resists include metallic cores complexed with one or more ligands in a solvent. In some embodiments, the resist includes metal particles. In some embodiments, the metal particles are nanoparticles. As used herein, nanoparticles are particles having an average particle size between about 1 nm and about 20 nm. In some embodiments, the metallic cores, including from 1 to about 18 metal particles, are complexed with one or more organic ligands in a solvent. In some embodiments, the metallic cores include 3, 6, 9, or more metal nanoparticles complexed with one or more organic ligands in a solvent.

In some embodiments, the metal particle is one or more of titanium (Ti), zinc (Zn), zirconium (Zr), nickel (Ni), cobalt (Co), manganese (Mn), copper (Cu), iron (Fe), strontium (Sr), tungsten (W), vanadium (V), chromium (Cr), tin (Sn), hafnium (Hf), indium (In), cadmium (Cd), molybdenum (Mo), tantalum (Ta), niobium (Nb), aluminum (Al), cesium (Cs), barium (Ba), lanthanum (La), cerium (Ce), silver (Ag), antimony (Sb), combinations thereof, or oxides thereof. In some embodiments, the metal particles include one or more selected from the group consisting of Ce, Ba, La, In, Sn, Ag, Sb, and oxides thereof.

In some embodiments, the metal nanoparticles have an average particle size between about 2 nm and about 5 nm. In some embodiments, the amount of metal nanoparticles in the resist composition ranges from about 0.5 wt. % to about 15 wt. % based on the weight of the nanoparticles and the solvent. In some embodiments, the amount of nanoparticles in the resist composition ranges from about 5 wt. % to about 10 wt. % based on the weight of the nanoparticles and the solvent. In some embodiments, the concentration of the metal particles ranges from 1 wt. % to 7 wt. % based on the weight of the solvent and the metal particles. Below about 0.5 wt. % metal nanoparticles, the resist coating is too thin. Above about 15 wt. % metal nanoparticles, the resist coating is too thick and viscous.

In some embodiments, the metallic core is complexed by a ligand, wherein the ligand includes branched or unbranched, cyclic or non-cyclic, saturated organic groups, including C1-C7 alkyl groups or C1-C7 fluoroalkyl groups. The C1-C7 alkyl groups or C1-C7 fluoroalkyl groups include one or more substituents selected from the group consisting of $-CF_3$, $-SH$, $-OH$, $=O$, $-S-$, $-P-$, $-PO_2$, $-C(=O)SH$, $-C(=O)OH$, $-C(=O)O-$, $-O-$, $-N-$, $-C(=O)NH$, $-SO_2OH$, $-SO_2SH$, $-SOH$, and $-SO_2-$. In some embodiments, the ligand includes one or more substituents selected from the group consisting of $-CF_3$, $-OH$, $-SH$, and $-C(=O)OH$ substituents.

In some embodiments, the ligand is a carboxylic acid or sulfonic acid ligand. For example, in some embodiments, the ligand is a methacrylic acid. In some embodiments, the metal particles are nanoparticles, and the metal nanoparticles are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen. In some embodiments, each metal particle is complexed by 1 to 25 ligand units. In some embodiments, each metal particle is complexed by 3 to 18 ligand units. In some embodiments, the organometallic In some embodiments, the resist composition includes about 0.1 wt. % to about 20 wt. % of the ligands based on the total weight of the resist composition. In some embodiments, the resist includes about 1 wt. % to about 10 wt. % of the ligands. In some embodiments, the ligand concentration is about 10 wt. % to about 40 wt. % based on the weight of the metal particles and the weight of the ligands. Below about 10 wt. %, ligand, the organometallic photoresist does not function well. Above about 40 wt. %, ligand, it is difficult to form a consistent photoresist layer. In some embodiments, the ligand(s) is dissolved at about a 5 wt. % to about 10 wt. % weight range in a coating solvent, such as propylene glycol methyl ether acetate (PGMEA) based on the weight of the ligand(s) and the solvent.

In some embodiments, the copolymers and the PACs, along with any desired additives or other agents, are added to the solvent for application. Once added, the mixture is then mixed in order to achieve a homogenous composition throughout the photoresist to ensure that there are no defects caused by uneven mixing or nonhomogeneous composition of the photoresist. Once mixed together, the photoresist may either be stored prior to its usage or used immediately.

The solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

Some embodiments of the photoresist include one or more photoactive compounds (PACs). The PACs are photoactive components, such as photoacid generators (PAG), photobase (PBG) generators, photo decomposable bases (PDB), free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

In some embodiments, a crosslinker is added to the photoresist. The crosslinker reacts with one group from one of the hydrocarbon structures in the polymer resin and also reacts with a second group from a separate one of the hydrocarbon structures in order to crosslink and bond the two hydrocarbon structures together. This bonding and crosslinking increases the molecular weight of the polymer products of the crosslinking reaction and increases the overall linking density of the photoresist. Such an increase in density and linking density helps to improve the resist pattern.

In some embodiments the crosslinker has the following structure:

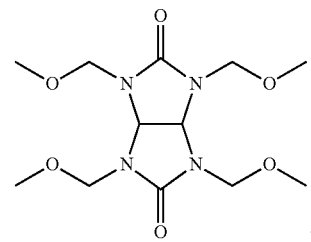

In other embodiments, the crosslinker has the following structure:

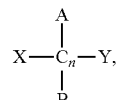

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxy chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the crosslinker include the following:

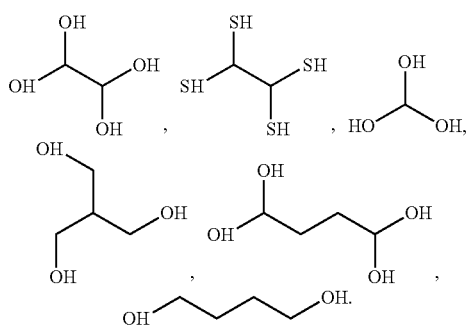

Alternatively, instead of or in addition to the crosslinker being added to the photoresist composition, a coupling reagent is added in some embodiments, in which the coupling reagent is added in addition to the crosslinker. The coupling reagent assists the crosslinking reaction by reacting with the groups on the hydrocarbon structure in the polymer resin before the crosslinker reagent, allowing for a reduction in the reaction energy of the cross-linking reaction and an increase in the rate of reaction. The bonded coupling reagent then reacts with the crosslinker, thereby coupling the crosslinker to the polymer resin.

Alternatively, in some embodiments in which the coupling reagent is added to the photoresist composition without the crosslinker, the coupling reagent is used to couple one group from one of the hydrocarbon structures in the polymer resin to a second group from a separate one of the hydrocarbon structures in order to cross-link and bond the two polymers together. However, in such an embodiment the coupling reagent, unlike the crosslinker, does not remain as part of the polymer, and only assists in bonding one hydrocarbon structure directly to another hydrocarbon structure.

In some embodiments, the coupling reagent has the following structure:

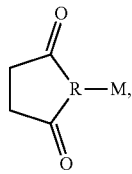

where R is a carbon atom, a nitrogen atom, a sulfur atom, or an oxygen atom; M includes a chlorine atom, a bromine atom, an iodine atom, $=NO_2$; $=SO_3-$; $=H=$; $=CN$; $=NCO$, $=OCN$; $=CO_2-$; $=OH$; $=OR^*$, $=OC(O)CR^*$; $=SR$, $=SO_2N(R^*)_2$; $=SO_2R^*$; $SOR$; $=OC(O)R^*$; $=C(O)OR^*$; $=C(O)R^*$; $=Si(OR^*)_3$; $=Si(R^*)_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

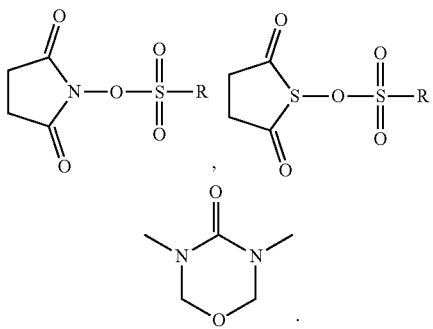

The individual components of the photoresist are placed into a solvent in order to aid in the mixing and dispensing of the photoresist. To aid in the mixing and dispensing of the photoresist, the solvent is chosen at least in part based upon the materials chosen for the polymer resin as well as the PACs. In some embodiments, the solvent is chosen such that the polymer resin and the PACs can be evenly dissolved into the solvent and dispensed upon the layer to be patterned.

In some embodiments, a quencher is added to the photoresist in some embodiments to inhibit diffusion of the generated acids/bases/free radicals within the photoresist. The quencher improves the resist pattern configuration as well as the stability of the photoresist over time.

Another additive added to the photoresist in some embodiments is a stabilizer, which assists in preventing undesired diffusion of the acids generated during exposure of the photoresist.

Another additive added to the photoresist in some embodiments is a dissolution inhibitor to help control dissolution of the photoresist during development.

A coloring agent is another additive added to the photoresist in some embodiments of the photoresist. The coloring agent observers examine the photoresist and find any defects that may need to be remedied prior to further processing.

Surface leveling agents are added to the photoresist in some embodiments to assist a top surface of the photoresist to be level, so that impinging light will not be adversely modified by an unlevel surface.

Once ready, the photoresist is applied onto the target layer 20, as shown in FIG. 2, to form a photoresist layer 15. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like. In some embodiments, the photoresist layer 15 thickness ranges from about 10 nm to about 300 nm.

FIGS. 3A and 3B illustrate selective exposures of the photoresist layer 15 and protective layer to form exposed regions 50 and 20b, respectively, and unexposed regions 52 and 20a, respectively. In some embodiments, the exposure to radiation is carried out by placing the photoresist coated substrate in a photolithography tool. The photolithography tool includes a photomask 30, optics, an exposure radiation source to provide the radiation 45 for exposure, and a movable stage for supporting and moving the substrate under the exposure radiation.

In some embodiments, the radiation source (not shown) supplies radiation 45, such as ultraviolet light, to the photoresist layer 15 in order to induce a reaction of the PACs, which in turn reacts with the polymer resin to chemically alter those regions of the photoresist layer to which the radiation 45 impinges. In some embodiments, the radiation is electromagnetic radiation, such as g-line (wavelength of about 436 nm), i-line (wavelength of about 365 nm), ultraviolet radiation, deep ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an F2 excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 45 is patterned by the photomask 30. In some embodiments, the optics include one or more lenses, mirrors, filters, and combinations thereof to control the radiation 45 along its path.

Next, the photoresist layer 15 undergoes a first post-exposure baking (PEB) in operation S120. In some embodiments, the photoresist layer 15 is heated at a temperature ranging from about 50° C. to about 160° C. for about 20 seconds to about 120 seconds. The post-exposure baking may be used in order to assist in the generating, dispersing, and reacting of the acid/base/free radical generated from the impingement of the radiation 45 upon the photoresist layer 15 during the exposure. Such assistance helps to create or enhance chemical reactions, which generate chemical differences between the exposed region 50 and the unexposed region 52 within the photoresist layer.

Figure 4:
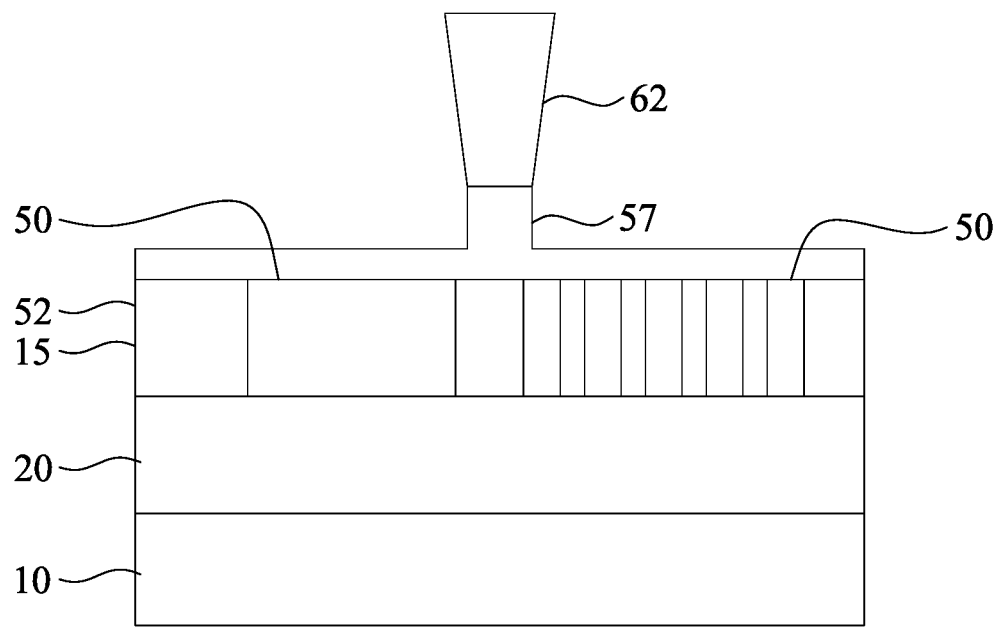
FIG. 4 shows a process stage of a sequential operation according to an embodiment of the disclosure.
Figure 5:
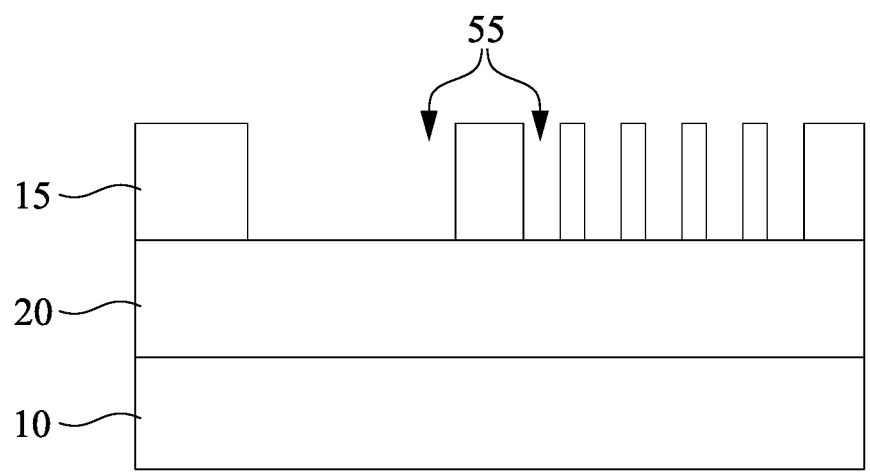
FIG. 5 shows a process stage of a sequential operation according to an embodiment of the disclosure.

The selectively exposed photoresist layer is subsequently developed by applying a developer to the selectively exposed photoresist layer in a first development operation S125. As shown in FIG. 4, a developer 57 is supplied from a dispenser 62 to the photoresist layer 15. When the photoresist layer is a positive tone photoresist, the exposed portion 50 of the photoresist layer is removed by the developer 57 forming a pattern of openings 55 in the photoresist layer 15 to expose the target layer 20, as shown in FIG. 5. On the other hand, when the photoresist layer is a negative tone photoresist, the unexposed portion 52 of the photoresist layer is removed by the developer 57 forming the pattern of openings 55 in the photoresist layer 15 to expose the target layer 20, as shown in FIG. 5.

In some embodiments, the developer 57 is applied to the photoresist layer 15 using a spin-on process. In the spin-on process, the developer 57 is applied to the photoresist layer 15 from above the photoresist layer 15 while the photoresist-coated substrate is rotated, as shown in FIG. 4. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature between about 10° C. and about 80° C. The development operation continues for between about 30 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer is an aqueous solution, such as an aqueous solution of tetramethylammonium hydroxide. In other embodiments, the developer 57 is an organic solvent. The organic solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, 4-methyl-2-pentanol, acetone, methyl ethyl ketone, dimethylformamide (DMF), isopropanol (IPA), tetrahydrofuran (THF), methyl isobutyl carbinol (MIBC), n-butyl acetate (nBA), 2-heptanone (MAK), tetrahydrofuran (THF), and dioxane.

Figure 6:
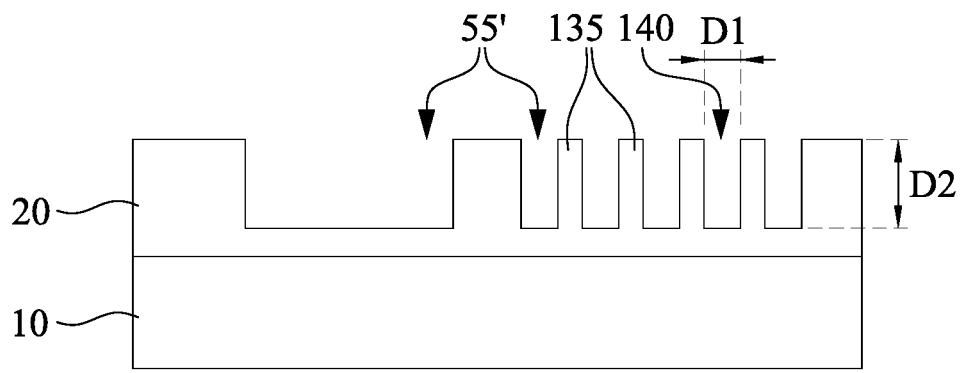
FIG. 6 shows a process stage of a sequential operation according to an embodiment of the disclosure.

In some embodiments, semiconductor device features are subsequently formed in operation S130. In some embodiments, forming semiconductor device features includes extending the pattern of openings 55 in the photoresist layer 15 into the target layer 20 to create a pattern of openings 55' in the target layer 20, as shown in FIG. 6. The pattern is extended into the target layer by etching, using one or more suitable etchants. In some embodiments, the photoresist layer pattern 50 is at least partially removed during the etching operation. In other embodiments, the remaining patterned photoresist layer 15 is removed after etching the target layer by using a suitable photoresist stripper solvent or by a photoresist ashing operation. In some embodiments, patterned features in the target layer 20 include a plurality of spaced-apart protrusions or projections 135 separated by a distance D. In some embodiments, the target layer is a semiconductor material, such as silicon, and the protrusions or projections 135 include fin structures. In some embodiments, field effect transistors (FETs) are formed on the fin structures.

In some embodiments, a first protrusion 135 and a second protrusion 135 are separated by a distance D1 ranging from about 5 nm to less than about 20 nm. In some embodiments, a depth D2 of a gap or recess 140 between the first protrusion or projection 135 and the second protrusion or projection 135 from the upper surfaces of the protrusions or projections ranges from about 10 nm to about 300 nm. In some embodiments, the aspect ratio of the width D1 of the gaps or recess 140 to the depth D2 of the gaps or recess (D1/D2) ranges from about 0.017 to about 2. In other embodiments, the aspect ratio (D1/D2) ranges from about 0.067 to about 0.5.

Figure 7:
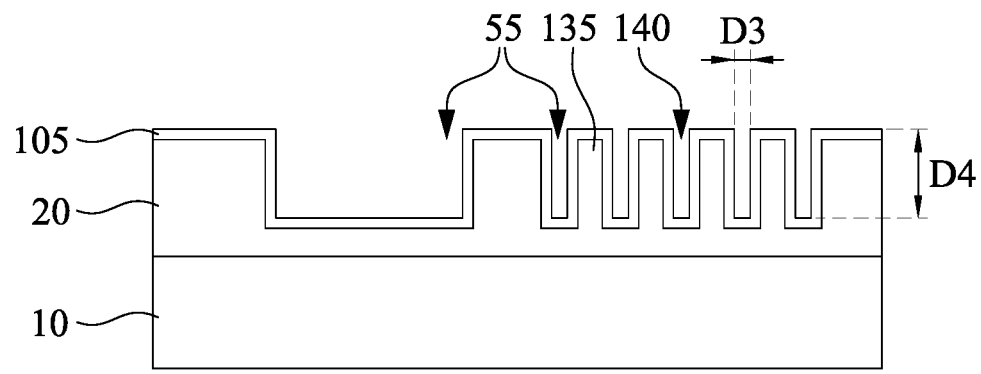
FIG. 7 shows a process stage of a sequential operation according to an embodiment of the disclosure.

In some embodiments, the forming device features operation S130 include additional operations such as forming conductive layers 105 over the patterned target layer 20, as shown in FIG. 7. In some embodiments, the conductive layers are metal layers. In some embodiments, the metal layers are made of one or more metals selected from tungsten, copper, nickel, titanium, tantalum, aluminum, and alloys thereof.

In some embodiments, the conductive layer 105 is formed by chemical vapor deposition (CVD); atomic layer deposition (ALD); and physical vapor deposition (PVD), including sputtering. In some embodiments, the conductive layer is conformally formed over the patterned features. In some embodiments, the conductive layer 105 has a thickness ranging from about 0.5 nm to about 20 nm. In some embodiments, adjacent patterned features are separated by a distance D3. In some embodiments, distance D3 ranges from about 5 nm to less than about 20 nm. In some embodiments, a depth D4 of a gap or recess 140 between adjacent features ranges from about 10 nm to about 300 nm.

Figure 8:
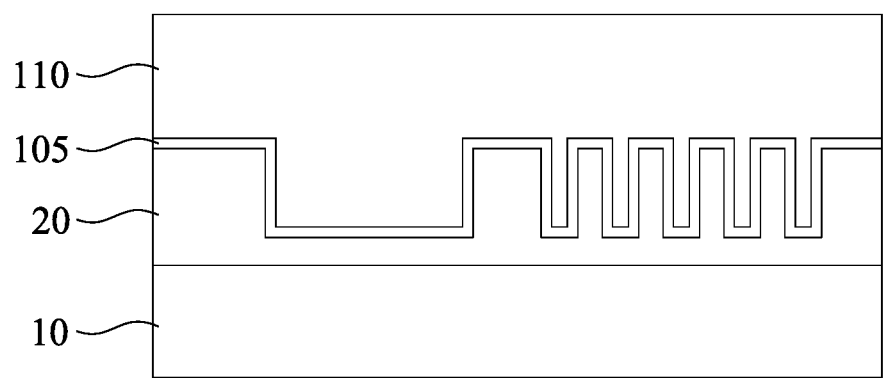
FIG. 8 shows a process stage of a sequential operation according to an embodiment of the disclosure.

A protective layer composition is coated on a surface of the patterned target layer 20 in operation S135, in some embodiments, to form a protective layer 110, as shown in FIG. 8. In some embodiments, the protective layer 110 is a bottom anti-reflection coating (BARC) layer or a planarizing layer. In some embodiments, the protective layer 110 (or underlayer) is a spin-on carbon layer. In some embodiments, the protective layer 110 has a thickness ranging from about 10 nm to about 2,000 nm. In some embodiments, the thickness of the protective layer ranges from about 200 nm to about 1,500 nm. Protective layer thicknesses less than the disclosed ranges may not provide sufficient protection to the semiconductor device features from subsequent wet processing operations. Protective layer thicknesses greater than the disclosed ranges may be unnecessarily thick and may not provide any additional significant protection of underlying device features.

Then the protective layer 110 (or underlayer) undergoes a baking operation S140 to evaporate solvents or cure the protective layer composition in some embodiments. In some embodiments, the baking operation S140 crosslinks the protective layer or underlayer composition. The protective layer 110 is baked at a temperature and time sufficient to cure and dry the protective layer 110. In some embodiments, the protective layer is heated at a temperature ranging from about 40° C. to about 400° C. for about 10 seconds to about 10 minutes. In other embodiments, the protective layer 110 is heated at a temperature ranging from about 100° C. to about 400° C. In other embodiments, the protective layer 110 is heated at a temperature ranging from about 250° C. to about 350° C. In other embodiments, the protective layer 110 is heated at a temperature ranging from about 200° C. to about 300° C. Heating the protective layer at temperatures below the disclosed ranges may result in insufficient curing or crosslinking, while heating the protective layer at temperatures greater than the disclosed ranges may result in damage to the protective layer and the underlying device features. In some embodiments, the curing operation S140 is performed by exposing the protective layer to actinic radiation. In some embodiments, the actinic radiation is ultraviolet radiation. In some embodiments, the ultraviolet radiation has a wavelength ranging from about 100 nm to less than about 300 nm.

In some embodiments, capillary force between the protective layer composition and the target layer 20 or conductive layer 105 enhances the gap filling of the protective layer composition. Polar groups in polymers in the protective layer composition may interact with the conductive layer 105 or the target layer 20, which may enhance the gap filling.

Figure 9:
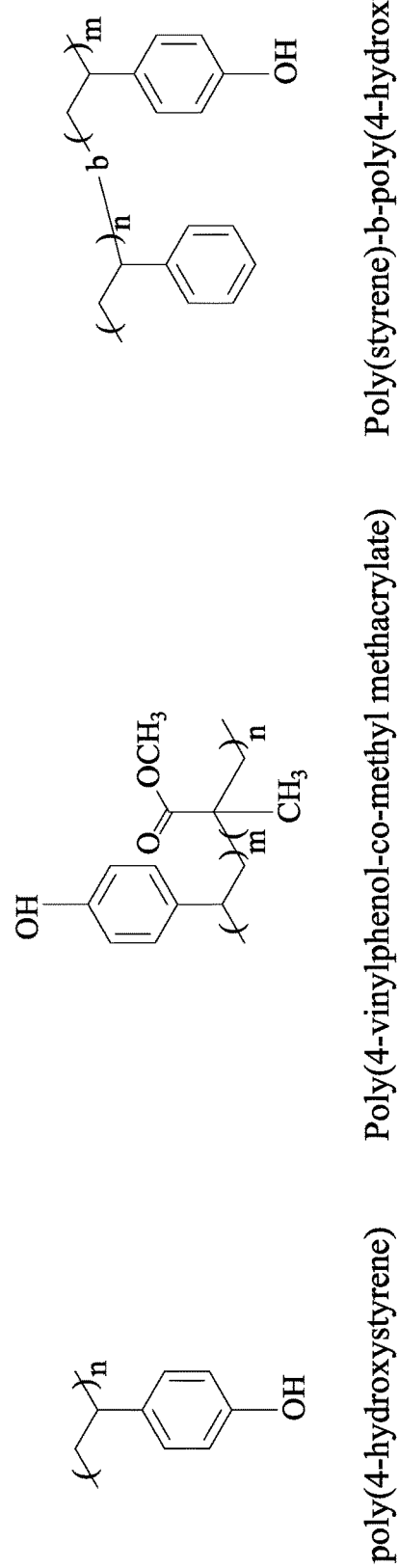
FIG. 9 illustrates polymers for protective layer compositions according to embodiments of the disclosure.

FIG. 9 illustrates some components of the protective layer, BARC, planarizing layer, underlayer, or spin-on carbon layer (the protective layer) composition according to some embodiments of the disclosure. In some embodiments, the protective layer composition includes an organic polymer, including, but not limited to polyhydroxystyrenes, polyacrylates, polymethacrylates, polyvinylphenols, polystyrenes, and copolymers thereof. In some embodiments, the organic polymer is a poly(4-hydroxystyrene), a poly(4-vinylphenol-co-methyl methacrylate) copolymer, and a poly(styrene)-b-poly(4-hydroxystyrene) copolymer, as illustrated in FIG. 9.

In some embodiments, the protective layer composition includes a carbon backbone polymer, a first crosslinker, and a second crosslinker.

In some embodiments, the first crosslinker is one or more selected from the group consisting of A—(OR)$_x$, A—(NR)O$_x$,

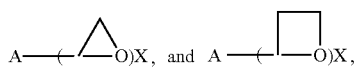

where A is a monomer, oligomer, or a second polymer having a molecular weight ranging from about 100 to about 20,000; R is an alkyl group, cycloalkyl group, cycloalkylepoxy group, or C3-C15 heterocyclic group; OR is an alkyloxy group, cycloalkyloxy group, carbonate group, alkylcarbonate group, alkyl carboxylate group, tosylate group, or mesylate group; NR is an alkylamide group or an alkylamino group; and x ranges from 2 to about 1000. In some embodiments, the molecular weight of the oligomer or second polymer is weight average molecular weight. In some embodiments, R is $(CH_2)_yCH_3$, where $0 \leq y \leq 14$. In some embodiments, OR is $(-O(CH_2CH_2O)_a-CH_2CH_3)$, where $1 \leq a \leq 6$. In some embodiments, R, OR, and NR include a chain structure, a ring structure, or a 3-D structure. In some embodiments, the 3-D structure is selected from the group consisting of norbornyl, adamantyl, basketanyl, twistanyl, cubanyl, and dodecahedranyl groups.

In some embodiments, the second crosslinker is one or more selected from the group consisting of A—(OH)$_x$, A—(OR')$_x$, A—(C=C)$_x$, and A—(C≡C)$_x$, where A is a monomer, oligomer, or a second polymer having a molecular weight ranging from 100 to 20,000; R' is an alkyloxy group, an alkenyl group, or an alkynyl group; and x ranges from 2 to about 1000. In some embodiments, R is $(CH_2)_yCH_3$, where $0 \leq y \leq 14$. In some embodiments, R and OR include a chain structure, a ring structure, or a 3-D structure. In some embodiments, the 3-D structure is selected from the group consisting of norbornyl, adamantyl, basketanyl, twistanyl, cubanyl, and dodecahedranyl groups.

In some embodiments, the carbon backbone polymer contains crosslinking sites on the polymer.

In some embodiments, a concentration of the first and second crosslinkers ranges from about 20 wt. % to about 50 wt. % of the total weight of the first and second crosslinkers and the carbon backbone polymer. In some embodiments, less than about 20 wt. % of the crosslinkers results in insufficient crosslinking. In some embodiments, more than about 50 wt. % of the crosslinkers provides no or only negligible improvement in the crosslinking. In some embodiments, the concentration of the first crosslinker ranges from about 5 wt. % to about 40 wt. % of the total weight of the first and second crosslinkers and the carbon backbone polymer. In some embodiments, the concentration of the second crosslinker ranges from about 5 wt. % to about 40 wt. % of the total weight of the first and second crosslinkers and the carbon backbone polymer. In some embodiments, the concentration of the first crosslinker is about the same as the concentration of the second crosslinker.

The protective layer 110 is subjected to a first heating at a temperature ranging from about 100° C. to about 170° C. in some embodiments to form a partially crosslinked layer. In some embodiments, the first heating is at a temperature ranging from about 100° C. to about 150° C.

The viscosity of the protective layer composition is selected so that it provides a target thickness when it is spin-coated on the substrate. In some embodiments, the protective layer composition has a viscosity of between about 0.1 to about 1×10$^6$ Pa·s at about 20° C. and is spin coated on the substrate at about 1500 rpm. The first heating at about 100° C. to about 170° C. causes partial polymer crosslinking and increases viscosity from about 0.11×10$^6$ Pa·s to about 100 Pa·s to about 1×10$^8$ Pas in some embodiments. The second heating at about 170° C. to about 300° C. causes further polymer crosslinking and increases the viscosity from about 100 Pa·s to about 1×10$^8$ Pa·s to a solid state layer. First heating temperatures below about 100° C. may result in insufficient partial crosslinking. First heating temperatures above about 170° C. may result in negligible additional partial crosslinking, or may prematurely trigger the second crosslinker. In some embodiments, the protective layer 110 is heated at the first temperature for about 10 seconds to about 5 minutes to partially crosslink the layer 110. In some embodiments, the first heating is performed for about 30 seconds to about 3 minutes. In some embodiments, the second heating is performed for about 30 seconds to about 3 minutes.

After the first heating, the protective layer 110 is allowed to cool at about 20° C. to about 25° C. for about 10 s to about 1 min in some embodiments. Then the layer 110 is subsequently subjected to a second heating at a second temperature higher than the first temperature to form a further or fully crosslinked layer 110. In some embodiments, the second temperature ranges from about 170° C. to about 300° C. In some embodiments, the second temperature ranges from about 180° C. to about 300° C. In some embodiments, the second temperature ranges from about 200° C. to about 280° C. Second heating at temperatures below about 170° C. may result in insufficient crosslinking. Second heating temperatures above about 300° C. or 400° C. may result in an unacceptable increase in layer reflow or decomposition or degradation of the organic material forming the layer 110. In some embodiments, the layer 110 is heated at the second temperature for about 30 seconds to about 3 minutes. In other embodiments, the second heating is performed for about 30 seconds to about 2 minutes. After the second heating, the protective layer is allowed to cool at about 20° C. to about 25° C. for about 10 s to about 1 min before performing subsequent processes.

Figure 10:
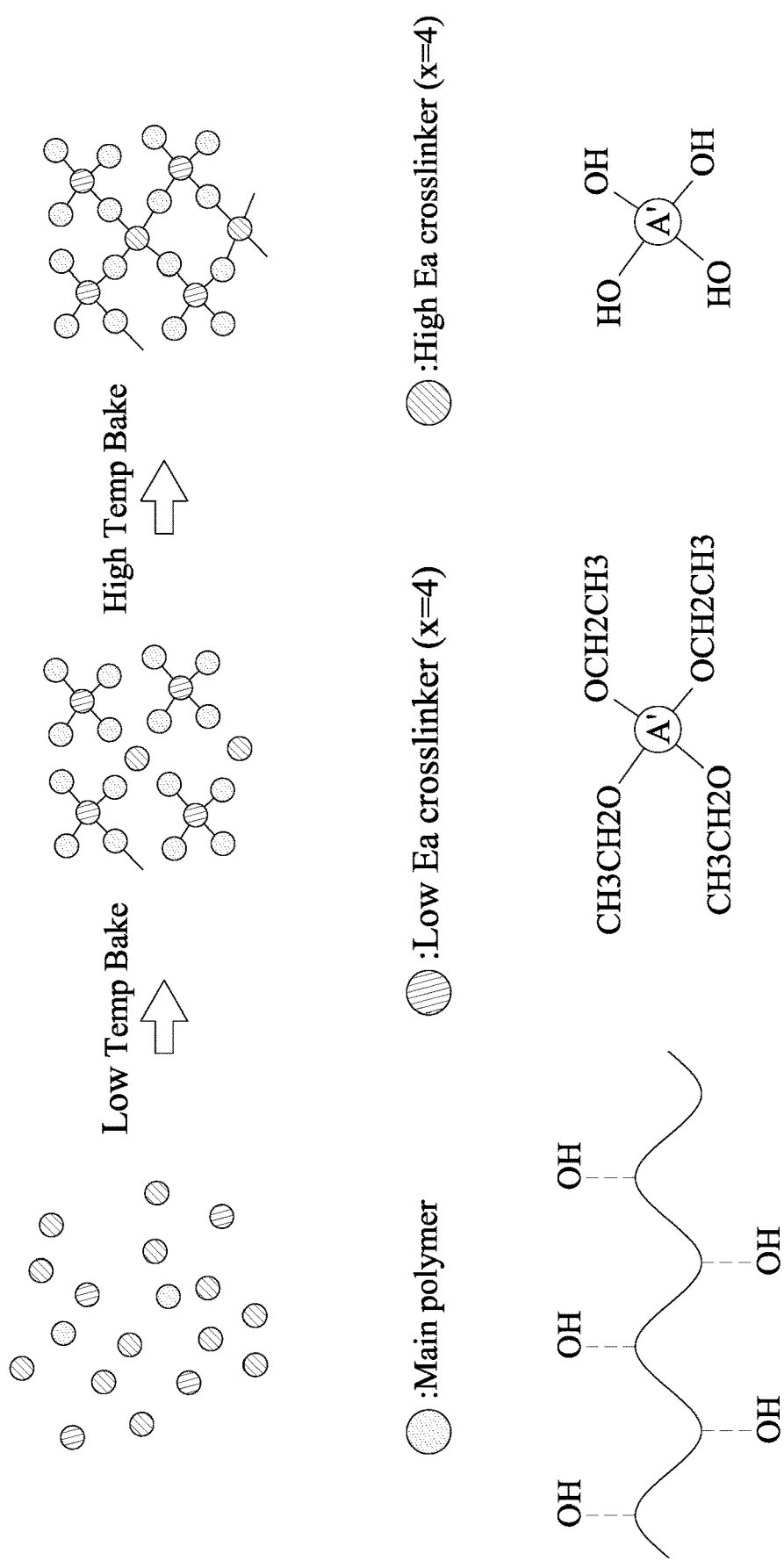
FIG. 10 illustrates polymers for protective layer compositions according to embodiments of the disclosure.

FIG. 10 illustrates an example of the crosslinking operations according to embodiments of the disclosure. In an embodiment, the protective layer includes a main polymer, such as polyhydroxystyrene, a low activation energy (Ea) crosslinker with four alkoxy crosslinking groups, and a high activation energy (Ea) crosslinker with four hydroxyl groups. The protective layer is subjected to a low temperature baking operation, such as heating at about 130° C., which triggers the low Ea crosslinker to partially crosslink the main polymer. Then, a high temperature baking operation is performed, such as heating at about 250° C., which triggers the high Ea crosslinker to more fully crosslink the main polymer.

Figure 11:
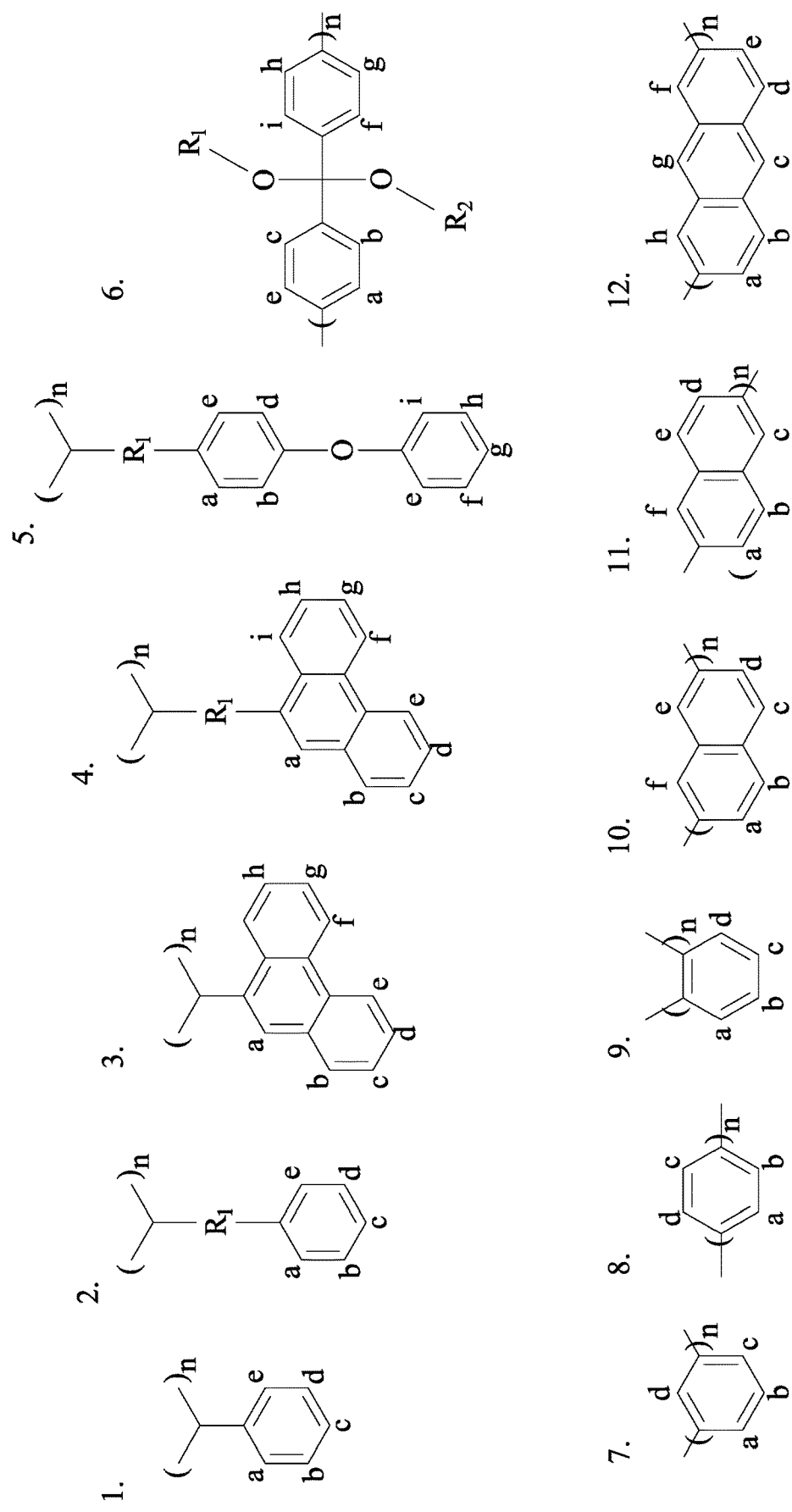
FIG. 11 illustrates polymers for protective layer compositions according to embodiments of the disclosure.
Figure 12A:
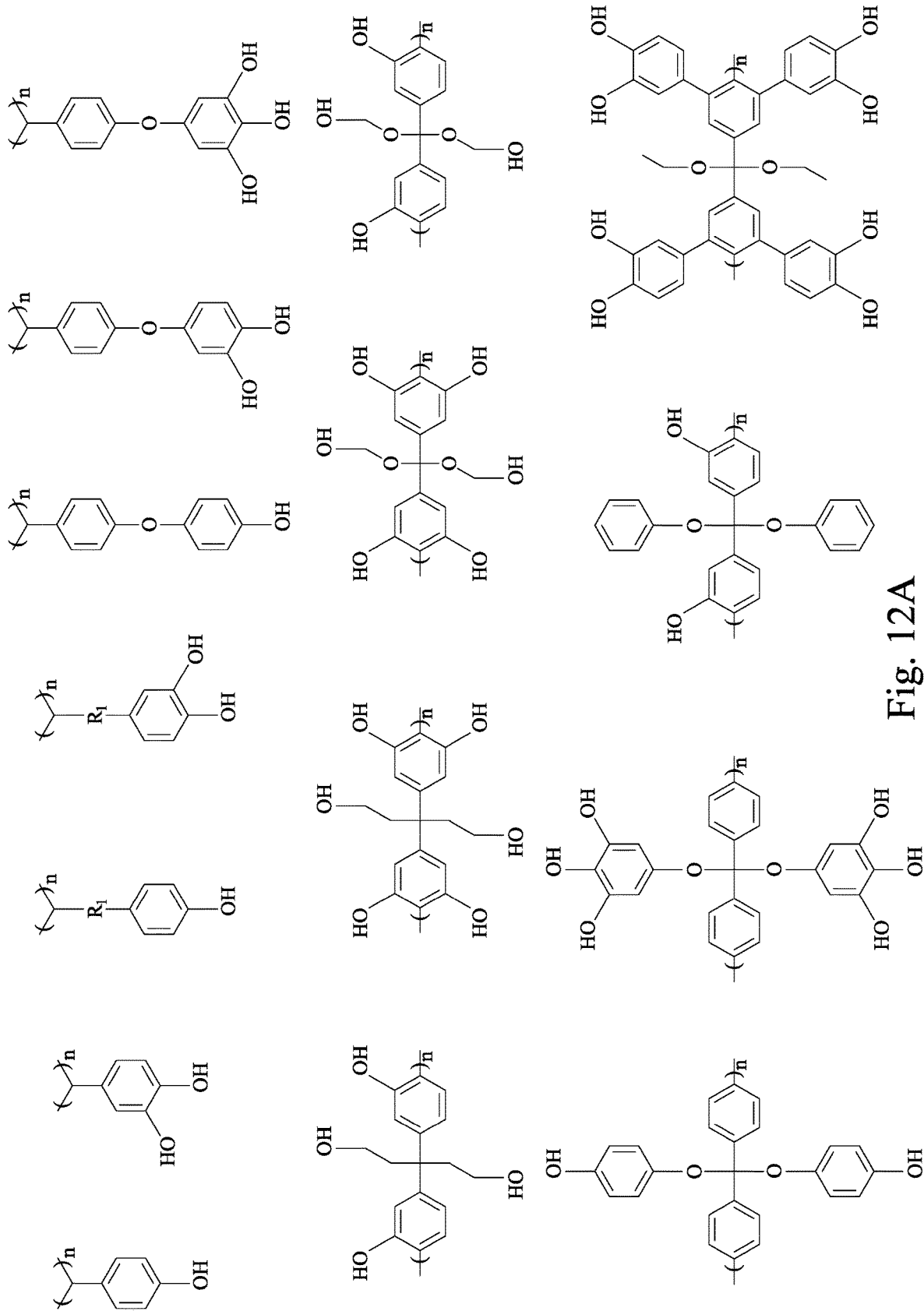
FIGS. 12A, 12B, and 12C illustrate polymers for protective layer compositions according to embodiments of the disclosure.
Figure 12B:
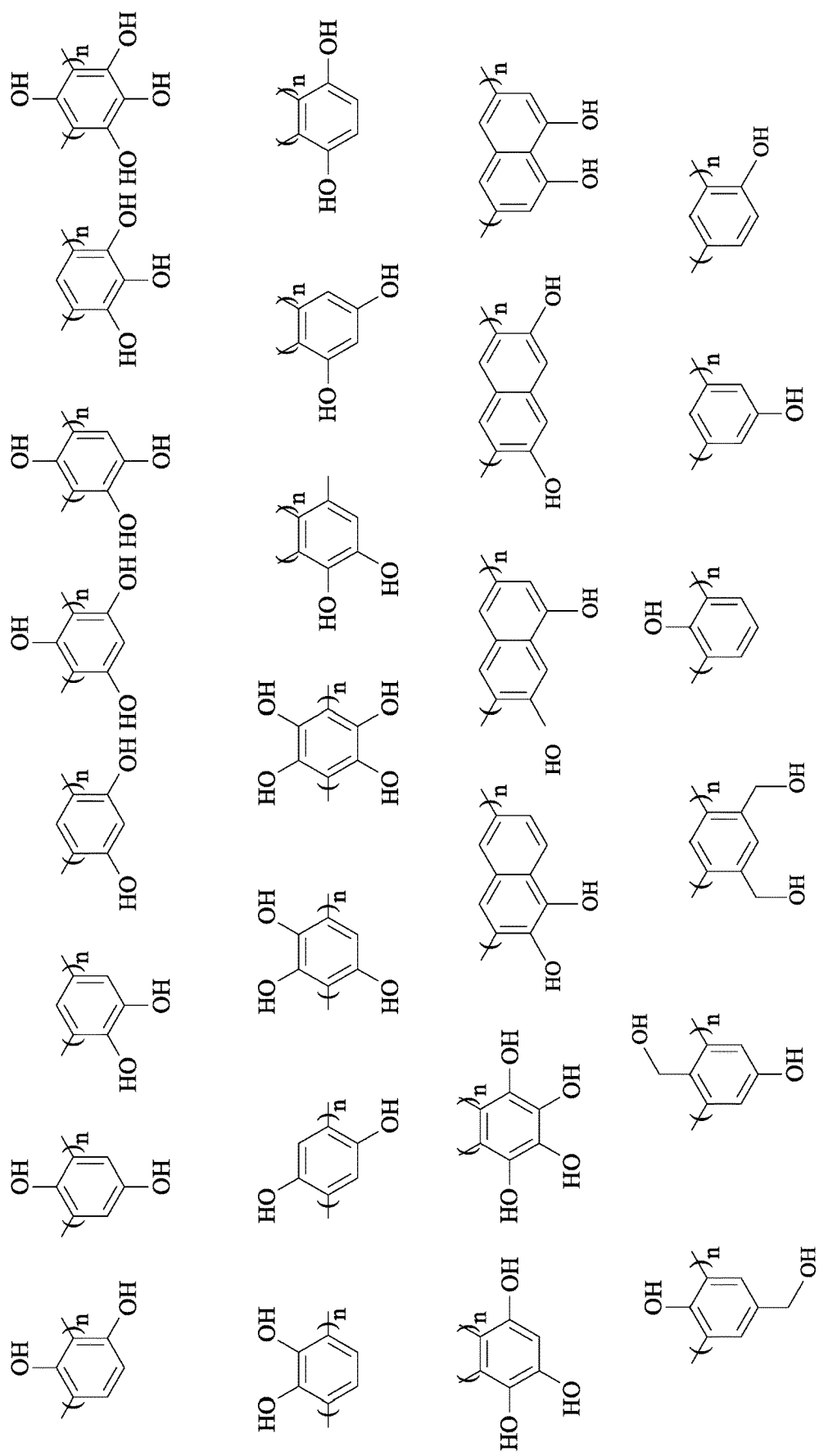
Figure 12C:
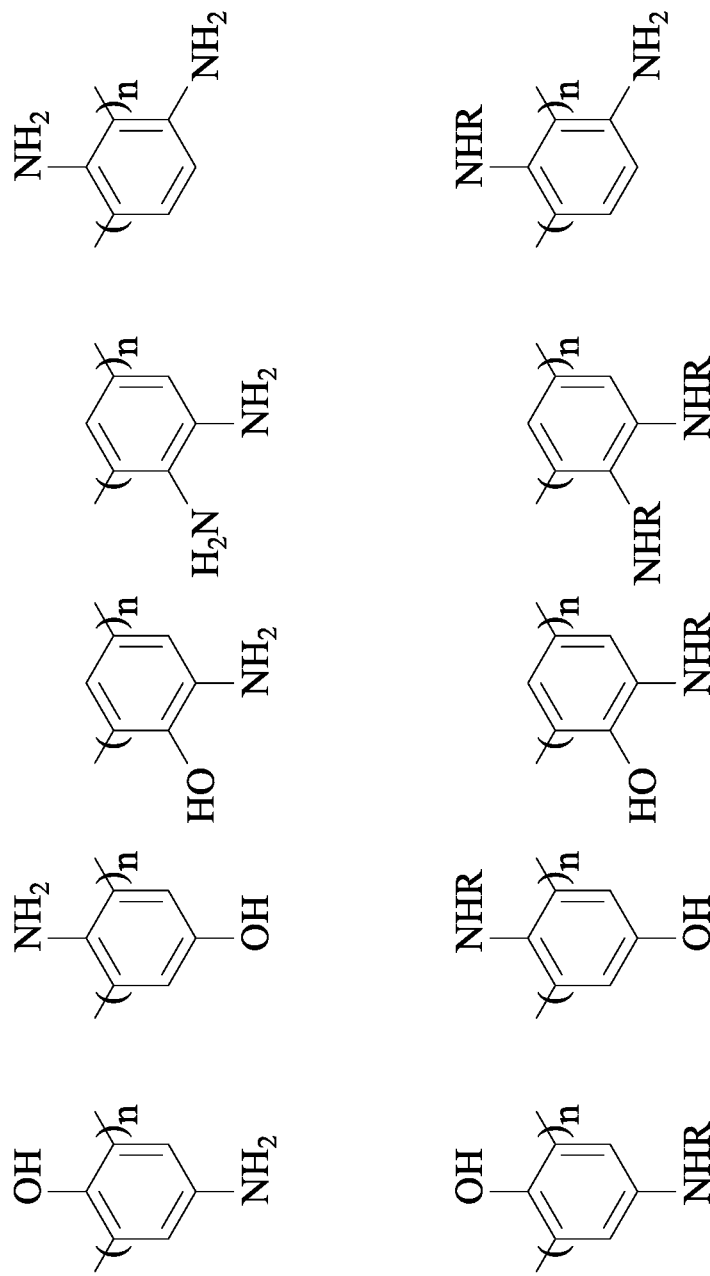

In some embodiments, the protective layer, BARC, planarizing layer, underlayer, or spin-on carbon layer (protective layer) is made of a polymer composition including polymers having one or more of repeating units 1-12 of FIG. 11. In FIG. 11, a, b, c, d, e, f, g, h, and i are each independently H, —OH, —ROH, —R(OH)$_2$, —NH$_2$, —NHR, —NR$_2$, —SH, —RSH, or —R(SH)$_2$, wherein at least one of a, b, c, d, e, f, g, h, and i on each repeating unit 1-12 is not H. R, R$_1$, and R$_2$ are each independently a C1-C10 alkyl group, a C3-C10 cycloalkyl group, a C1-C10 hydroxyalkyl group, a C2-C10 alkoxy group, a C2-C10 alkoxy alkyl group, a C2-C10 acetyl group, a C3-C10 acetylalkyl group, a C1-C10 carboxyl group, a C2-C10 alkyl carboxyl group, or a C4-C10 cycloalkyl carboxyl group, and n is 2-1000. Polymers formed of the repeating units 1-12 of FIG. 11 may crosslink upon heating or exposure to actinic radiation. In some embodiments, the protective layer composition includes one or more of a crosslinker or a coupling reagent. The crosslinker crosslinks the protective layer composition when heated or exposed to actinic radiation. Examples of repeating units 1-12 according to embodiments of the disclosure are shown in FIGS. 12A, 12B, and 12C. In some embodiments, each of the repeating units include two or more functional groups.

In some embodiments, the polymer includes repeating units having one or more of hydroxyl groups, amine groups, or mercapto groups. In some embodiments, each repeating unit includes at least two functional groups selected from one or more of —OH, —ROH, —R(OH)$_2$, —NH$_2$, —NHR, —NR$_2$, —SH, —RSH, or —R(SH)$_2$, wherein R is a C1-C10 alkyl group, a C3-C10 cycloalkyl group, a C1-C10 hydroxyalkyl group, a C2-C10 alkoxy group, a C2-C10 alkoxy alkyl group, a C2-C10 acetyl group, a C3-C10 acetylalkyl group, a C1-C10 carboxyl group, a C2-C10 alkyl carboxyl group, or a C4-C10 cycloalkyl carboxyl group.

In some embodiments, protective layer composition includes a polymer having one or more of the repeating units disclosed in FIGS. 11-12C disclosed herein. In some embodiments, at least one repeating unit includes three or more of —OH, —ROH, —R(OH)$_2$, —NH$_2$, —NHR, —NR$_2$, —SH, —RSH, or —R(SH)$_2$. In some embodiments, the polymer includes at least one repeating unit having three or more —OH groups.

In some embodiments the crosslinker has the following structure:

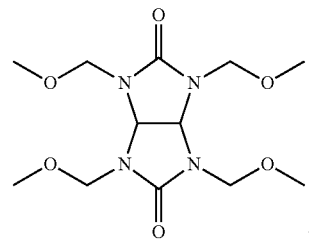

In other embodiments, the crosslinker has the following structure:

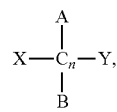

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the crosslinker include the following:

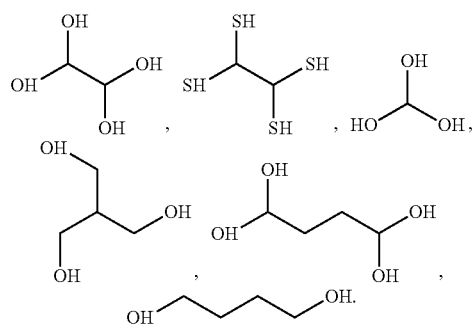

Alternatively, instead of or in addition to the crosslinker being added to the protective layer composition, a coupling reagent is added in some embodiments. The coupling reagent assists the crosslinking reaction by reacting with the groups on the hydrocarbon structure in the polymer before the crosslinker, allowing for a reduction in the reaction energy of the crosslinking reaction and an increase in the rate of reaction. The bonded coupling reagent then reacts with the crosslinker, thereby coupling the crosslinker to the polymer.

Alternatively, in some embodiments in which the coupling reagent is added to the protective layer composition without the crosslinker, the coupling reagent is used to couple one group from one of the hydrocarbon structures in the polymer to a second group from a separate one of the hydrocarbon structures in order to crosslink and bond the two polymers together. However, in such an embodiment the coupling reagent, unlike the crosslinker, does not remain as part of the polymer, and only assists in bonding one hydrocarbon structure directly to another hydrocarbon structure.

In some embodiments, the coupling reagent has the following structure:

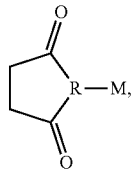

where R is a carbon atom, a nitrogen atom, a sulfur atom, or an oxygen atom; M includes a chlorine atom, a bromine atom, an iodine atom, =NO$_2$; =SO$_3$—; =H=; =CN; =NCO, =OCN; =CO$_2$—; =OH; =OR*, =OC(O)CR*; =SR, =SO$_2$N(R*)$_2$; =SO$_2$R*; SOR; =OC(O)R*; =C(O)OR*; =C(O)R*; =Si(OR*)$_3$; =Si(R*)$_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

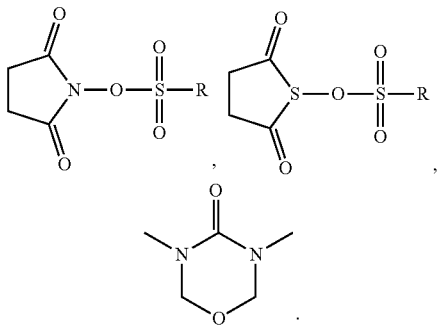

In some embodiments, the protective layer 110 is formed by preparing a protective layer coating composition of a polymer and optional crosslinker or coupling reagent in a solvent. The solvent can be any suitable solvent for dissolving the polymer. The protective layer coating composition is applied over a target layer 20, such as by spin coating. Then the protective layer composition is baked to dry the protective layer and crosslink the polymer, as explained herein.

In some embodiments, the protective layer, BARC, planarizing layer, underlayer, or spin-on carbon layer (the protective layer) composition includes a solvent. In some embodiments, the solvent is chosen such that the polymers and additives, such as crosslinkers, can be evenly dissolved into the solvent and dispensed upon the substrate.

In some embodiments, the solvent is an organic solvent, and includes one or more of any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent for the protective layer include, acetone, methanol, ethanol, propanol, isopropanol (IPA), n-butanol, toluene, xylene, 4-hydroxy-4-methyl-2-pentanone, tetrahydrofuran (THF), methyl ethyl ketone, cyclohexanone (CHN), methyl isoamyl ketone, 2-heptanone (MAK), ethylene glycol, 1-ethoxy-2-propanol, methyl isobutyl carbinol (MIBC), ethylene glycol monoacetate, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, methyl acetate, ethyl acetate, propyl acetate, n-butyl acetate (nBA), methyl lactate, ethyl lactate (EL), propyl lactate, butyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether acetate, propylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, ethyl 3-ethoxypropionate, methyl 3-methoxypropionate, methyl 3-ethoxypropionate, and ethyl 3-methoxypropionate, β-propiolactone, β-butyrolactone, y-butyrolactone (GBL), a-methyl-y-butyrolactone, β-methyl-y-butyrolactone, y-valerolactone, y-caprolactone, y-octanoic lactone, a-hydroxy-y-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, 3-methylcyclohexanone, 4-methylcyclohexanone, 4-ethylcyclohexanone, 2,2-dimethylcyclohexanone, 2,6-dimethylcyclohexanone, 2,2,6- trimethylcyclohexanone, cycloheptanone, 2-methylcycloheptanone, 3-methylcycloheptanone, propylene carbonate, vinylene carbonate, ethylene carbonate, butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylether, monophenylether, dipropylene glycol monoacetate, dioxane, methyl pyruvate, ethyl pyruvate, propyl pyruvate, methyl methoxypropionate, ethyl ethoxypropionate, n-methylpyrrolidone (NMP), 2-methoxyethyl ether (diglyme), ethylene glycol monomethyl ether, propylene glycol monomethyl ether, methyl propionate, ethyl propionate, ethyl ethoxy propionate, methylethyl ketone, cyclopentanone, ethyl 3-ethoxypropionate, propylene glycol methyl ether acetate (PGMEA), methylene cellosolve, 2-ethoxyethanol, N-methylformamide, N,N-dimethylformamide (DMF), N-methylformanilide, N-methylacetamide, N,N-dimethylacetamide, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, phenyl cellosolve acetate, or the like.

Polar groups in the protective layer composition, such as polar functional groups on the polymer in the protective layer composition, can increase adhesion of the protective layer to the target layer, resulting in improved gap filling. However, because the polar groups are hydrophilic they also enable increased penetration of polar cleaning and etching solutions into the protective layer. Polar cleaning and etching solutions include: Standard Clean 1 (SC1), a $NH_4OH/H_2O_2/H_2O$ solution; Standard Clean 2, a $H_2O/HCl/H_2O_2$ solution; $HF/H_2O$; SPM, a $H_2SO_4/H_2O_2$ solution; and $NH_4OH$, and deionized (DI) $H_2O$. The penetration of the polar cleaning and etching solutions into the protective layer can result in film loss, protective layer swelling, and protective layer peeling, and resulting damage to the underlying target layer or conductive layer. Embodiments of the present disclosure reduce the hydrophilicity of the protective layer or convert the hydrophilic protective layer to a hydrophobic protective layer (also called a polar switch) to prevent the penetration of the polar cleaning and etching solutions into the protective layer.

In some embodiments, the protective layer is treated with a chemical to reduce its hydrophilicity in operation S145 (see FIG. 1). In some embodiments, the chemical treatment is applied to the protective layer 110. In some embodiments, the chemical applied to the protective layer is an ethylene oxide (EO), a propylene oxide (PO), or combinations thereof. The ethylene oxides and propylene oxides include functional end groups that interact or crosslink with the protective layer polymer in some embodiments. In some embodiments, the functional end groups are epoxy groups. The EO and PO have high penetration capacity in the organic protective layer 110 and EO/PO has a chelated function to cap polar units in protective layer 110. Moreover, the functional end group (e.g., an epoxy group) advances a crosslinking reaction with polar unit in the protective, which also further reduces hydrophilicity in some embodiments.

Figure 13:
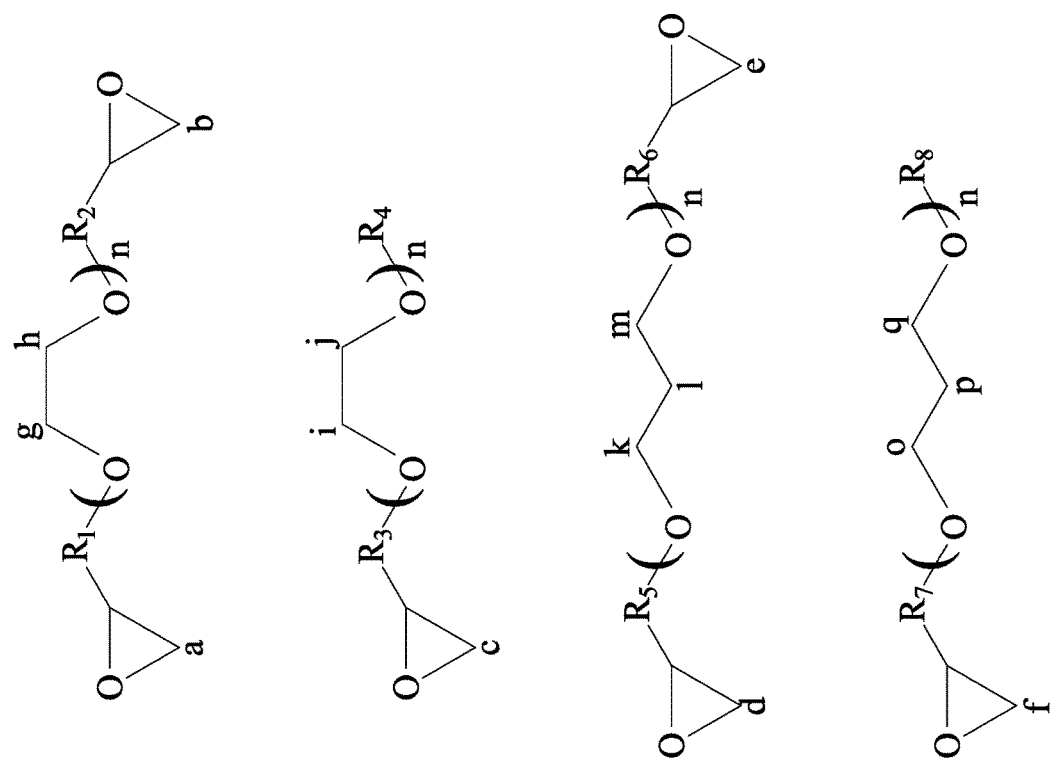
FIG. 13 illustrates protective layer capping materials according to embodiments of the disclosure.
Figure 14:
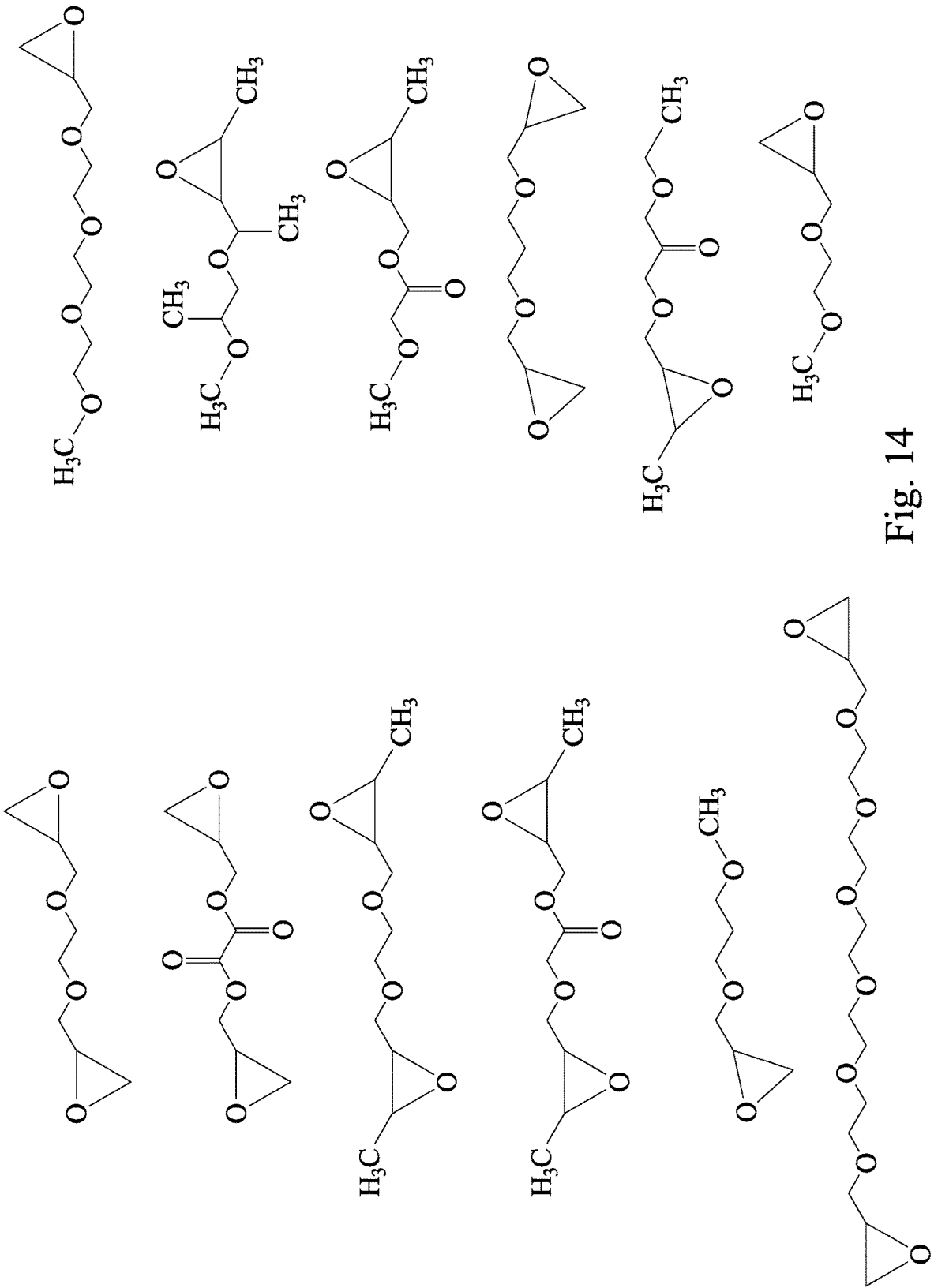
FIG. 14 illustrates examples of protective layer capping materials according to embodiments of the disclosure.

FIG. 13 illustrates structures of the EO and PO compounds according to embodiments of the disclosure. In FIG. 13, a, b, c, d, e, and f are each independently H or a methyl group; g, h, i, j, k, l, m, o, and p are each independently H, a carbonyl group, or a C1-C5 alkyl group; R1, R2, R3, R4, R5, R6, R7, and R8 are each independently a C1-C10 alkyl group; and n is 1 to about 1000. In some embodiments, the C1-C5 alkyl group and C1-C10 alkyl groups are substituted with one or more selected from the groups consisting of —F, —Cl, —Br, —I, —OH, —C═O, —C(═O)OH, —C(═O)NH, —NH₂, and —SH. In some embodiments, the EO or PO compounds have a molecular weight of about 150 to about 20000. Specific examples of the EO and PO compounds, according to some embodiments, are illustrated in FIG. 14.

In some embodiments, the EO/PO compounds are mixed in a polar solvent and then the mixture is applied to the protective layer 110. The EO/PO compounds are added to the solvent at an amount of about 0.1 wt. % to about 50 wt. % based on the entire weight of the mixture. In some embodiments, the polar solvent is one or more selected from the group consisting of water, acetic acid, methanol, ethanol, n-propanol, isopropanol, n-butanol, sec-butanol, tert-butanol, acetone, ethyl acetate, dimethyl sulfoxide, acetonitrile, and dimethylformamide.

Figures 15A, 15B:
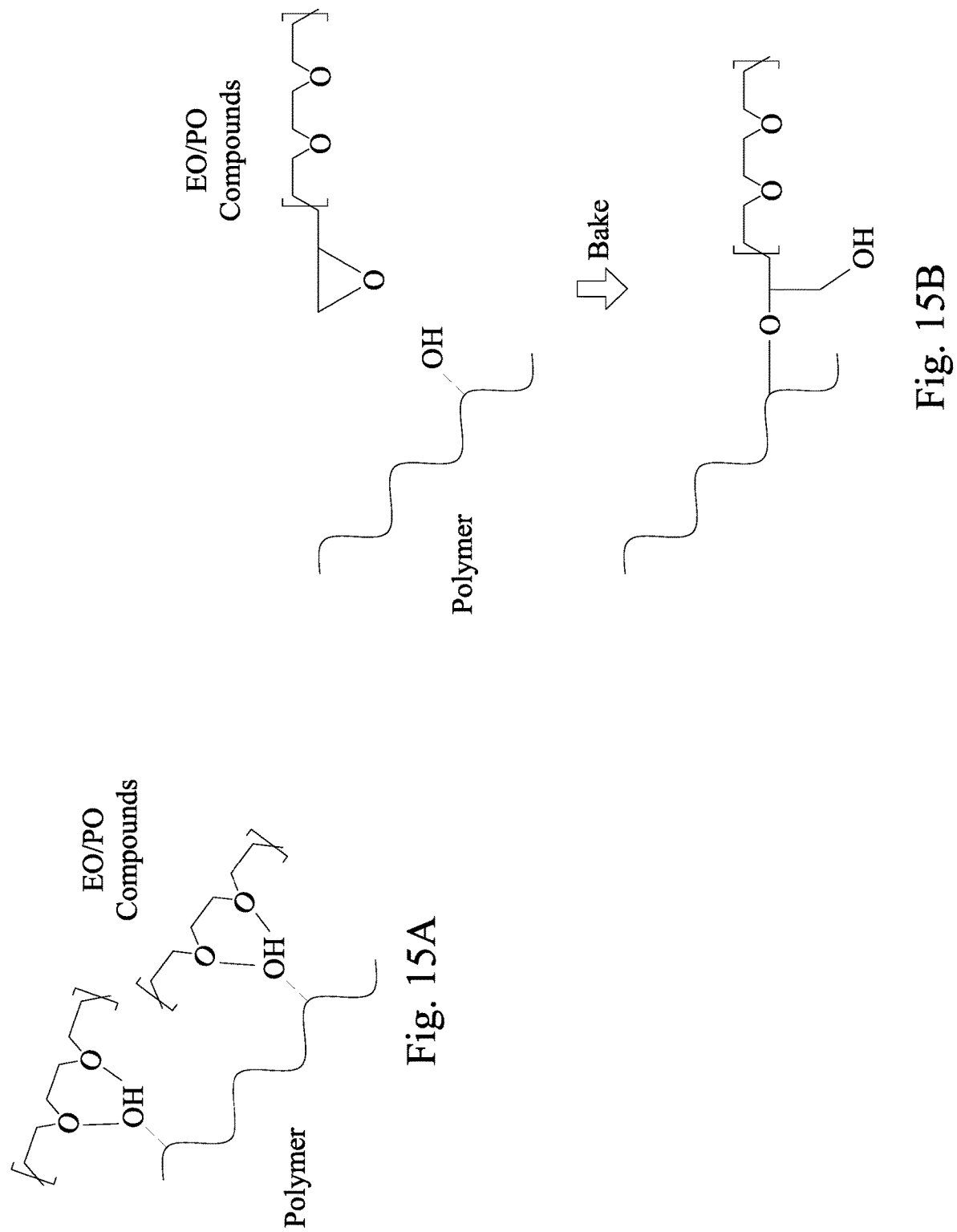
FIGS. 15A and 15B illustrate reactions of protective layer capping materials with protective layer polymers.

In some embodiments, the EO/PO compounds interact with the polar groups on the protective layer polymer by hydrogen bonding, thereby capping the polar groups, as shown in FIG. 15A. In other embodiments, the EO/PO compounds are reacted with and chemically bond with the polar groups on the protective layer polymer, as shown in FIG. 15B. In some embodiments, the EO/PO compounds react with and crosslink adjacent protective layer polymers. In some embodiments, the treatment of the protective layer S145 includes baking the protective layer 110 to drive off the solvents in the EO/PO composition or advance the reaction between EO/PO compounds and the protective layer polymer. In some embodiments, the chemically treated protective layer 110 is heated at a temperature ranging from about 40° C. to about 400° C. to drive off the solvent or react the EO/PO compound with the protective layer polymer. In some embodiments, the chemically treated protective layer 110 is heated at a temperature ranging from about 100° C. to about 300° C., and in other embodiments, the chemically treated protective layer 110 is heated at a temperature ranging from about 150° C. to about 250° C. Heating at temperatures below the disclosed range may not sufficiently drive off the solvent or react the EO/PO compound with the protective layer polymer. Heating at temperatures above the disclosed range may damage the protective layer and underlying layers. After the chemical treatment operation S145, the protective layer 110 is converted to a protective layer 110' having reduced hydrophilicity, or the protective layer 110 is converted from a hydrophilic layer 110 to a hydrophobic layer 110'.

Figure 16:
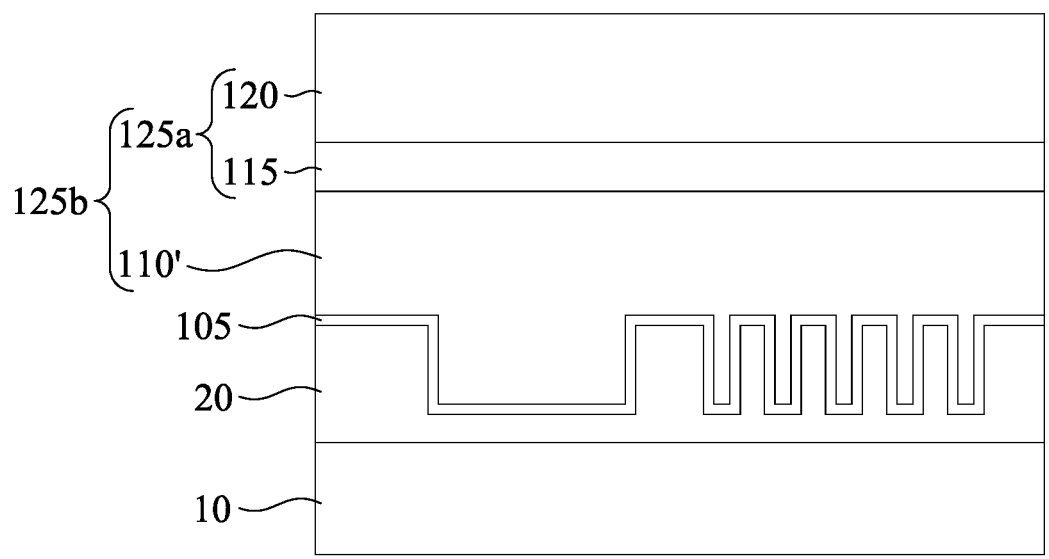
FIG. 16 shows a process stage of a sequential operation according to an embodiment of the disclosure.

A resist layer composition is subsequently coated over the protective layer 110' in operation S150, in some embodiments, to form a resist layer 125a, as shown in FIG. 16. In some embodiments, the resist layer 125 includes a middle layer 115 and a photoresist layer 120 disposed over the middle layer 115. In some embodiments, the middle layer 115 is a silicon-containing layer. In some embodiments, the protective layer 110' is a bottom layer of a tri-layer resist 125b made up of the protective layer (bottom layer) 110', middle layer 115, and photoresist layer 120. In some embodiments, the resist layer composition is coated on the protective layer 110 prior to curing and chemically treating the protective layer 110, and the resist layer 125a and protective layer 20 are baked together in a single curing operation to drive off solvents of the layers and cause crosslinking of the protective layer 110.

The photoresist layer 120 can be made of any of the photoresist compositions disclosed herein with respect to photoresist layer 15 formed in FIG. 2.

The middle layer 115 of the tri-layer resist structure may have a composition that provides anti-reflective properties for the photolithography operation and/or hard mask properties. In some embodiments, the middle layer 115 includes a silicon-containing layer (e.g., a silicon hard mask material). The middle layer 115 may include a silicon-containing inorganic polymer. In other embodiments, the middle layer includes a siloxane polymer. In other embodiments, the middle layer 115 includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. The middle layer 115 may be bonded to adjacent layers, such as by covalent bonding, hydrogen bonding, or hydrophilic-to-hydrophilic forces.

Thus, the middle layer 115 may include a composition that allows a covalent bond to be formed between the middle layer and the overlying photoresist layer 115 after an exposure process and/or subsequent baking process. In some embodiments, the middle layer 115 includes an additive compound or component having a photo base generator (PBG). This PBG generates a base that interacts with the exposed photoresist and provides for covalent bonding between the middle layer and a component of the overlying photoresist layer. In some embodiments, the middle layer 115 includes a siloxane polymer and a PBG.

After the photoresist layer 125 is formed, a pre-exposure bake (pre-baking) of the photoresist layer is performed in some embodiments in operation S155 to cure and dry the photoresist prior to radiation exposure (see FIG. 1). The pre-exposure baking conditions are the same as disclosed with respect to operation S110.

Figure 17A:
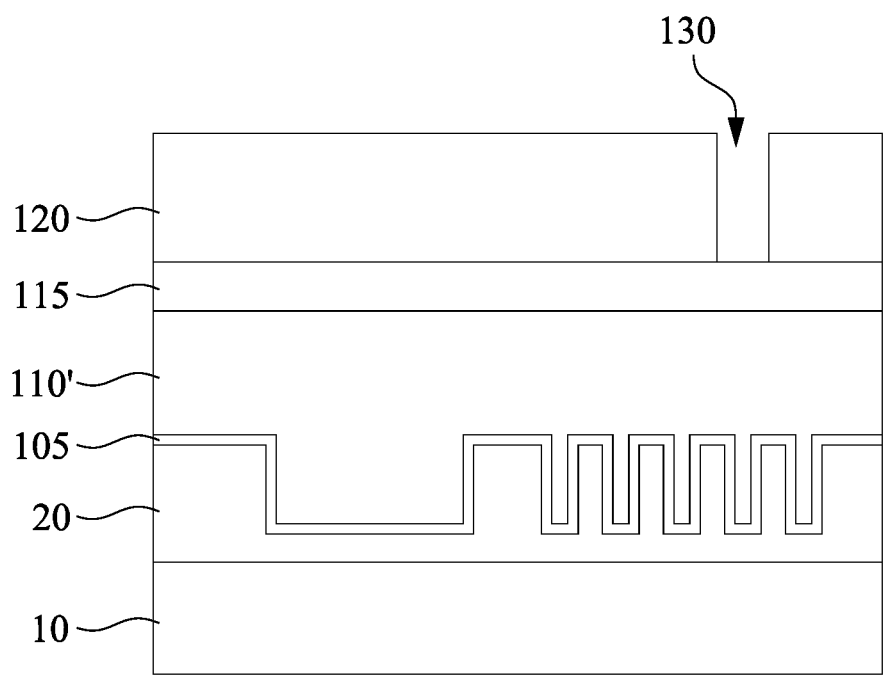
FIGS. 17A, 17B, and 17C show process stages of a sequential operation according to embodiments of the disclosure.

The photoresist layer is subsequently selectively or patternwise exposed to actinic radiation in operation S160, subjected to a post-exposure baking in operation S165, and developed in operation S170 (see FIG. 1) to form an opening 130 or a pattern in the photoresist layer 125 in some embodiments, as shown in FIG. 17A. The selective or patternwise exposure is performed under the same conditions and parameter disclosed herein with respect to operation S115 and FIGS. 3A and 3B. The post-exposure baking is performed under the same conditions and parameters as disclosed herein with respect to operation S120, and the development is performed under the same conditions and parameters as disclosed herein with respect to operation S125.

Figure 17B:
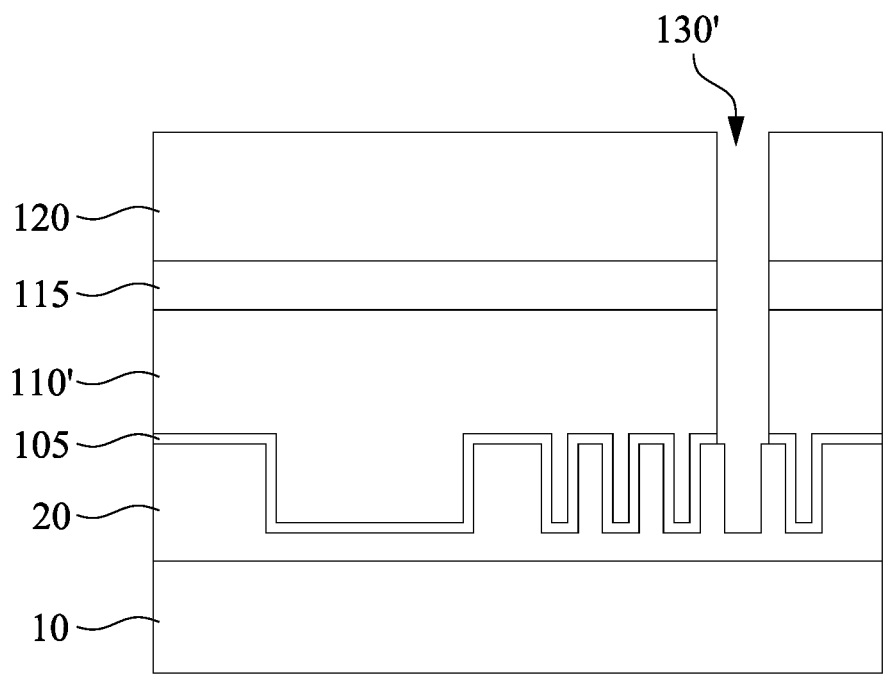
Figure 17C:
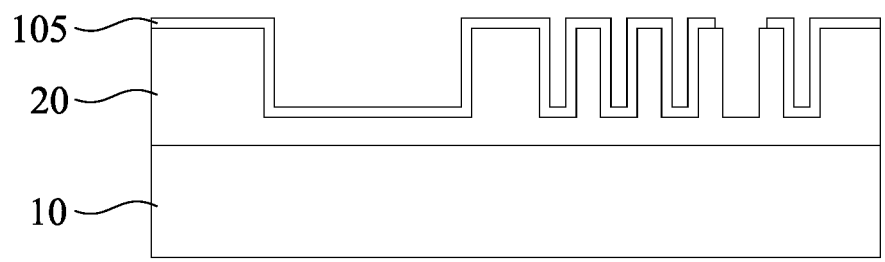

Additional semiconductor device manufacturing operations S175 are subsequently performed in some embodiments (see FIG. 1). In some embodiments, the additional semiconductor device manufacturing operations S175 include wet cleaning operations. Wet cleaning operations can be performed between any of the operations described herein. In some embodiments, the opening or pattern 130 in the photoresist layer is extended through the optional middle layer 115 and the protective layer 110' using suitable etchants selective to each respective layer to form an extended opening or pattern 130'. In some embodiments, an exposed portion of the conductive layer 105 in the extended opening or pattern 130' is removed using a suitable etching operation, as shown in FIG. 17B. In some embodiments, a wet cleaning operation is performed before the photoresist layer 120 and protective layer 110' are removed. The protective layer 110' protects the portions of the conductive layer 105 not removed during the etching operation from damage from the etchant chemicals and the wet cleaning chemicals. The resist layer and protective layer are subsequently removed using suitable photoresist stripping, etching, or plasma ashing operations, as shown in FIG. 17C.

Figure 18A:
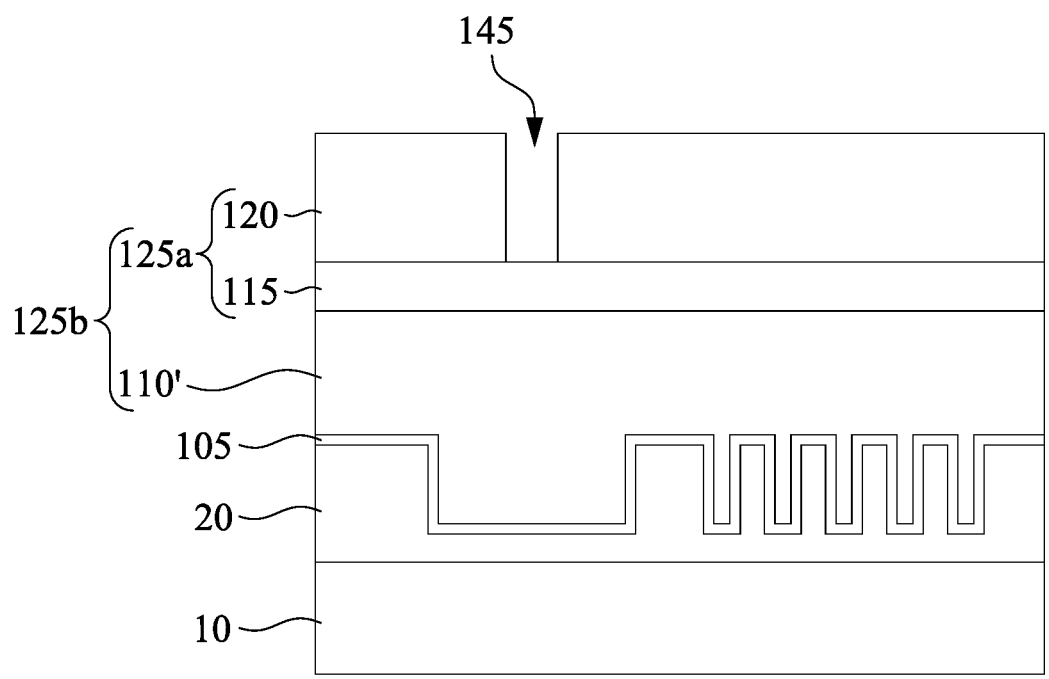
FIGS. 18A, 18B, and 18C show process stages of a sequential operation according to embodiments of the disclosure.
Figure 18B:
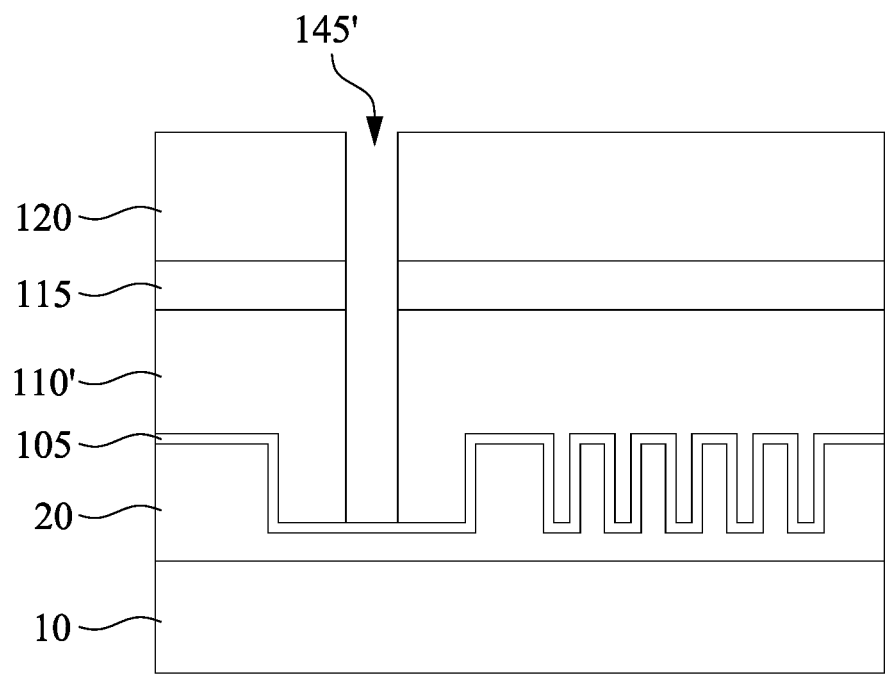
Figure 18C:
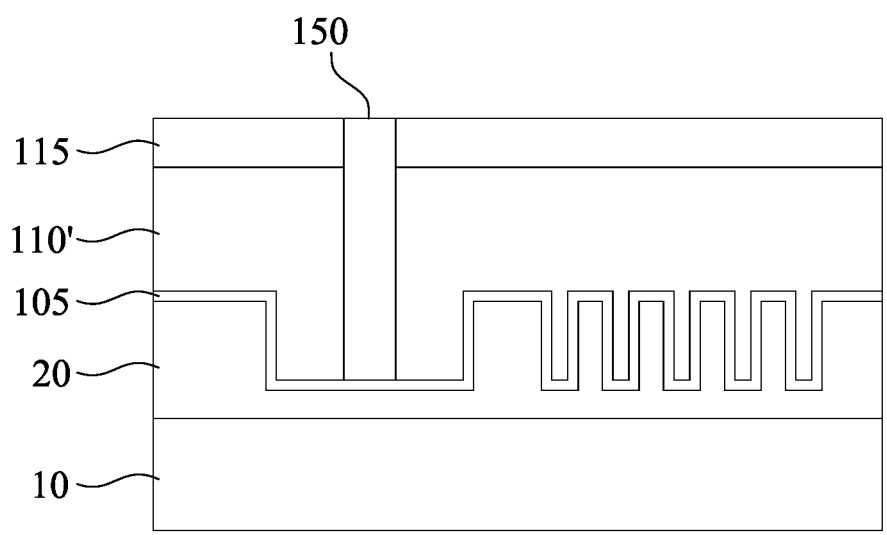

In other embodiments, the additional manufacturing operations S175 include forming an opening or pattern in the photoresist layer, as shown in FIG. 18A. The opening or pattern 145 is extended through the optional middle layer 115 and the protective layer 110' to form an extended opening or via 145', as shown in FIG. 18B to expose a portion of the underlying semiconductor device features, such as the conductive layer 105. In some embodiments, a wet cleaning operation is performed before the photoresist layer 120 and protective layer 110' are removed. The protective layer 110' protects the portions of the conductive layer 105 covered by the protective layer 110' from damage from the etchant chemicals and the wet cleaning chemicals. The photoresist layer is removed by a suitable photoresist stripping or plasma ashing operation and a conductive contact 150 is subsequently formed connected to the conductive layer 105 by filling the extended opening or via 145' by a suitable deposition technique, as shown in FIG. 18C. In some embodiments, the deposition techniques include CVD, PVD, or ALD techniques. In some embodiments, the conductive contact is formed of one or more metals selected from tungsten, copper, nickel, titanium, tantalum, aluminum, and alloys thereof. In some embodiments a planarizing operation, such as chemical-mechanical polishing or an etch back operation is performed to remove metal deposited over the upper surface of the remaining resist layer, for example the middle layer 115.

In some embodiments, the protective layer of the present disclosure is used in the manufacture of semiconductor devices, such as a gate structure of a field effect transistor (FET). The embodiments such as those disclosed herein are generally applicable not only to planar FETs but also to a fin FET (FinFET), a double-gate FET, a surround-gate FET, an omega-gate FET or a gate-all-around (GAA) FET, and/or nanowire transistors, or any suitable device having one or more work function adjustment material (WFM) layers in the gate structure.

In FET structures, forming multiple devices with different threshold voltages (Vt), the composition and thickness of metal gate layers play a crucial role in defining the Vt. Multiple FETs having different threshold voltages can be realized by adjusting materials and/or thicknesses of one or more work function adjustment material (WFM) layers disposed between a gate dielectric layer and a body metal gate electrode layer (e.g., a W layer). However, when the WFM layers are subjected to etching and cleaning operations, portions of the WFM layer not being etched or cleaned may be damaged by the etchant or cleaning solution, which affects its work function and thereby affects threshold voltage and degrades device performance.

In the following embodiment, methods of protecting WFM layers from damage during etching and cleaning operations are discussed.

Figure 19:
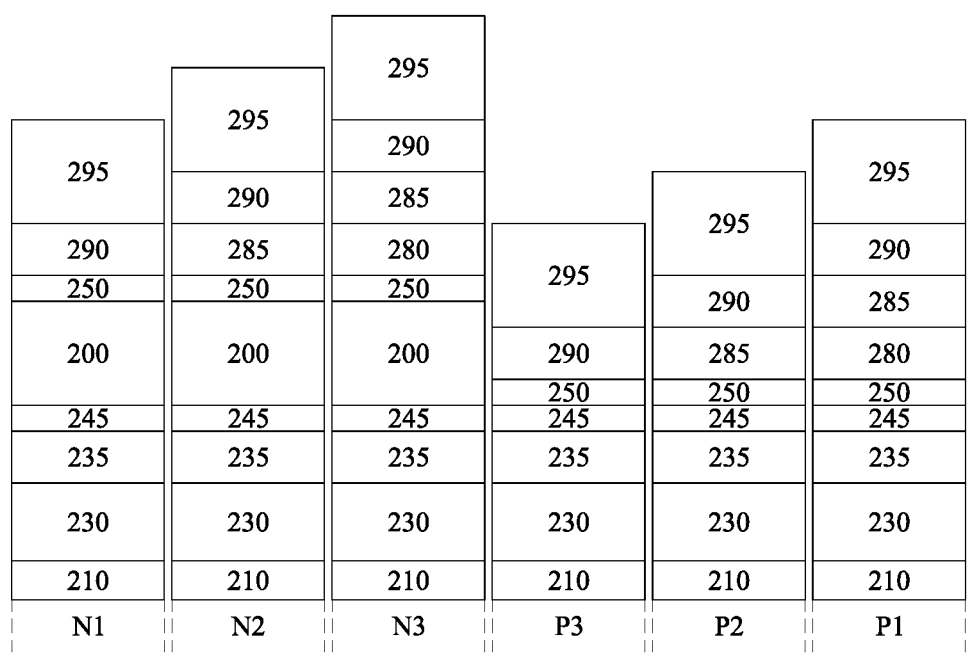
FIG. 19 shows a semiconductor device manufactured by a method according to an embodiment of the disclosure.

FIG. 19 shows a cross section view of gate structures for FETs with different threshold voltages according to an embodiment of the present disclosure. In some embodiments, a semiconductor device includes a first n-type FET N1, a second n-type FET N2, a third n-type FET N3, a first p-type FET P1, a second p-type FET P2 and a third p-type FET P3. A threshold voltage of the first n-type FET N1 is smaller in an absolute value than a threshold voltage of the second n-type FET N2 and the threshold voltage of the second n-type FET N2 is smaller in an absolute value than a threshold voltage of the third n-type FET N3. Similarly, a threshold voltage of the first n-type FET P1 is smaller in an absolute value than a threshold voltage of the second p-type FET P2 and the threshold voltage of the second p-type FET P2 is smaller in an absolute value than a threshold voltage of the third p-type FET P3.

Figures 20K, 20L:
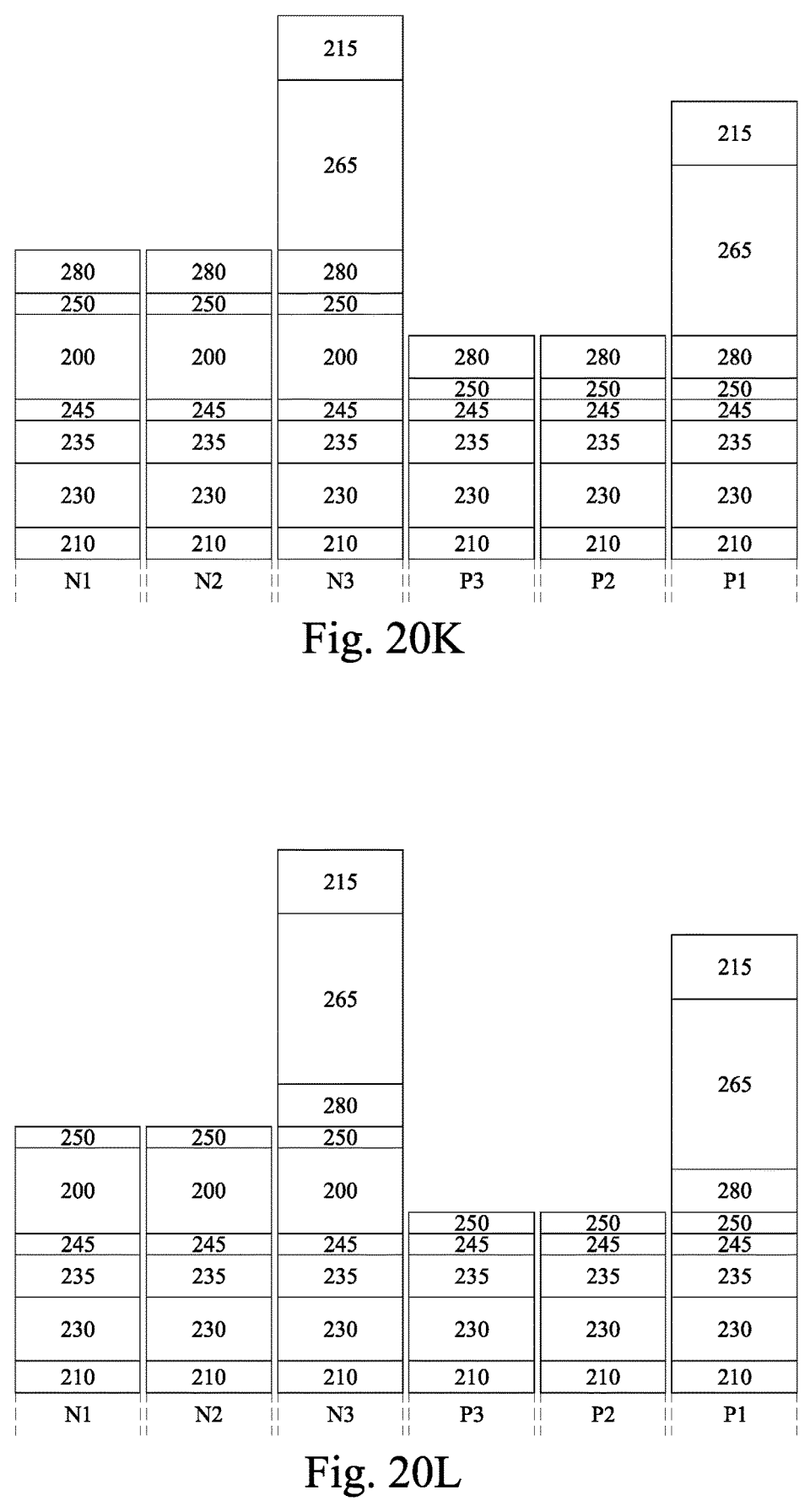
Figures 20M, 20N:
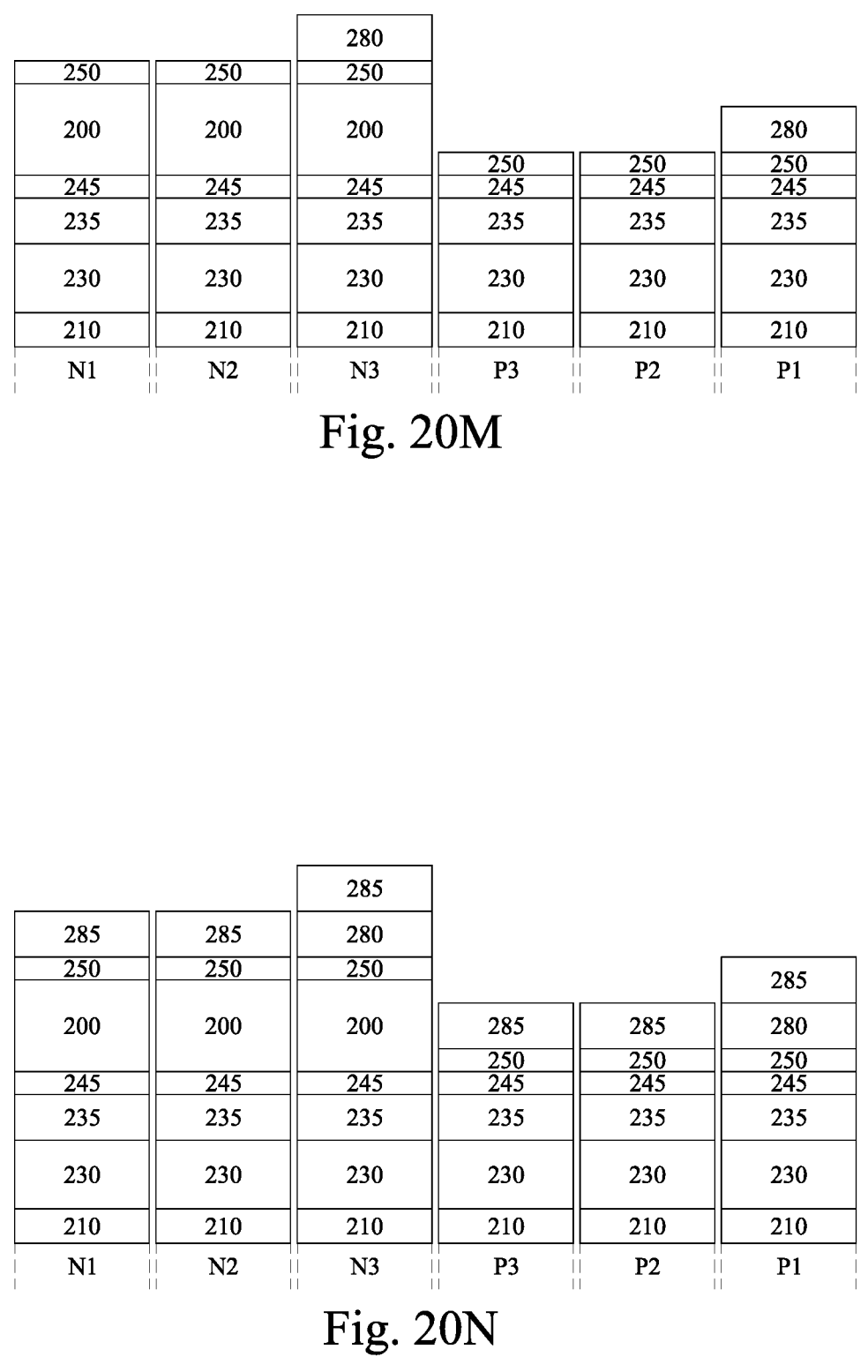
Figure 20O:
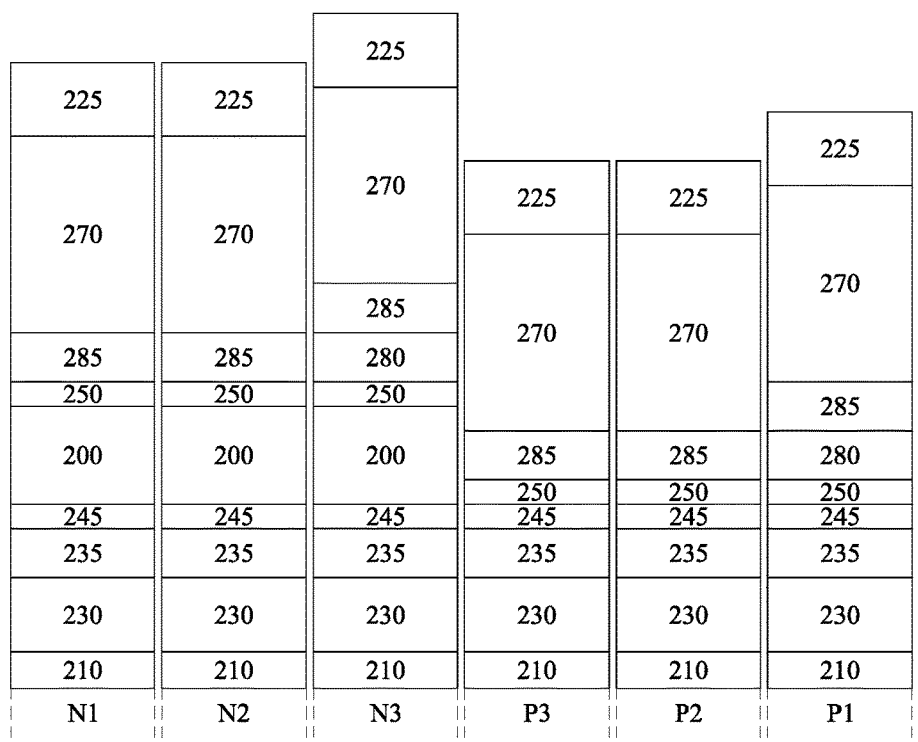
Figure 20P:
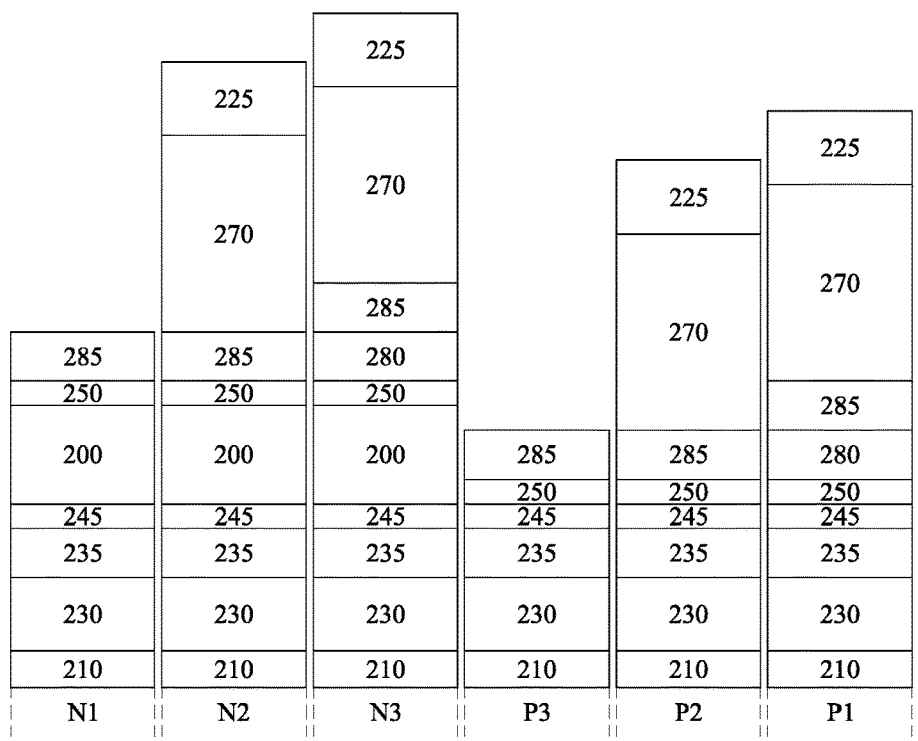
Figure 20Q:
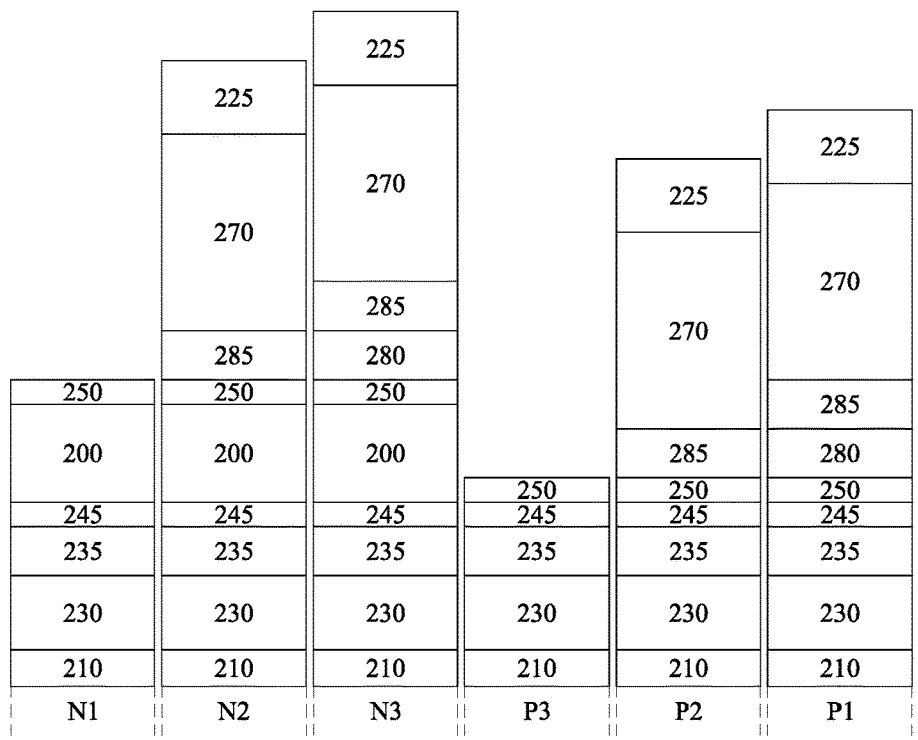
Figure 20R:
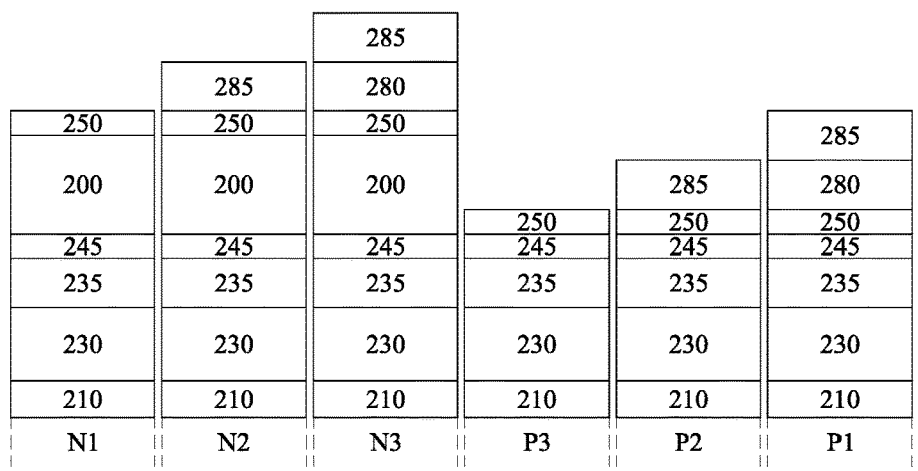

FIGS. 20A-20R show cross sectional views of various stages of manufacturing the semiconductor device shown in FIG. 19, according to embodiments of the present disclosure. It is understood that in the sequential manufacturing process, one or more additional operations can be provided before, during, and after the stages shown FIGS. 20A-20R and some of the operations described below can be replaced or eliminated for additional embodiments of the method. The order of the operations/processes may be interchangeable. Accordingly, one or more operations as shown in FIGS. 20A-20R may be omitted or replaced with another operation depending on the structure of the semiconductor device.

FIG. 20A illustrates a plurality of channel regions of a first n-type FET N1, a second n-type FET N2, a third n-type FET N3, a first p-type FET P1, a second p-type FET P2 and a third p-type FET P3, respectively. An interfacial layer 210 is formed over each of the channel regions. A gate dielectric layer (e.g., a high-k gate dielectric layer) 230 is formed over each of the interfacial layers 210. A first conductive layer, as a cap layer 235, is formed over each of the gate dielectric layers 230.

In some embodiments, the interfacial layer 210 is formed by using chemical oxidation. In some embodiments, the interfacial layer 210 includes one of silicon oxide, silicon nitride and mixed silicon-germanium oxide. The thickness of the interfacial layer 210 is in a range from about 0.2 nm to about 6 nm in some embodiments. In some embodiments, the gate dielectric layer 230 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$ or other suitable high-k dielectric materials, and/or combinations thereof. The gate dielectric layer 230 may be formed by CVD, ALD or any suitable method. In one embodiment, the gate dielectric layer 230 is formed using a highly conformal deposition process such as ALD in order to ensure the formation of a gate dielectric layer having a uniform thickness around each channel layer. The thickness of the gate dielectric layer 230 is in a range from about 1 nm to about 100 nm in some embodiments. In some embodiments, the first conductive layer 235 is a TiN or TiSiN layer formed by CVD, ALD or any suitable method.

In some embodiments, a second conductive layer, as a first barrier layer 245, is formed on the cap layer 235, as shown in FIG. 20B. In some embodiments, the cap layer 235 is removed after an annealing operation and the first barrier layer 245 is not formed. In some embodiments, the second conductive layer 245 includes a metal nitride, such as WN, TaN, TiN and TiSiN. In some embodiments, TaN is used. The thickness of the second conductive layer 245 is in a range from about 0.3 nm to about 30 nm in some embodiments, and is in a range from about 0.5 nm to about 25 nm in other embodiments. In some embodiments, the second conductive layer 245 functions as a barrier layer or an etch stop layer. In some embodiments, the second conductive layer 245 is thinner than the first conductive layer 235.

As shown in FIG. 20C, a WFM layer 200 is formed in some embodiments. In some embodiments, the WFM layer 200 is an n-type WFM layer. In some embodiments, the WFM layer is made of a conductive material such as a single layer of TiN, WN, TaAlC, TiC, TaAl, TaC, Co, Al, TiAl, or TiAlC, or a multilayer of two or more of these materials. For an n-type FET, an aluminum containing layer, such as TiAl, TiAlC, TaAl and/or TaAlC is used as an n-type WFM layer 200, and for a p-type FET, one or more of TaN, TiN, WN, TiC, WCN, MoN and/or Co is used as a p-type WFM layer in some embodiments. In some embodiments, an n-type WFM layer is composed of materials having a low work function in a range from about 2.5 eV to about 4.4 eV and/or having low electronegativity. In some embodiments, a p-type WFM layer is composed of materials having a high work function in a range from about 4.3 eV to 5.8 eV and/or having high electronegativity. In some embodiments, a thickness of the n-type WFM layer 200 is in a range from about 0.6 nm to about 40 nm, and is in a range from about 1 nm to about 20 nm in other embodiments.

A first patterning operation is performed to remove the n-type WFM layer 200 from the regions for the first p-type FET P1, the second p-type FET P2 and the third p-type FET P3. In some embodiments, a protective layer 260 made of the protective layer compositions disclosed herein with reference to FIGS. 9-12C is formed over each of the n-type WFM layers 200. The protective layer 260 is subsequently treated to become less hydrophilic or more hydrophobic, as disclosed herein with reference to FIGS. 13-15B, and a photoresist layer 205 made of the photoresist composition disclosed herein with reference to FIG. 2 is formed over the each of the protective layers 260, as shown in FIG. 20D. By using one or more lithography operations, the photoresist layer 205 is patterned to expose the protective layer 260 at the regions for the p-type FETs. Then, the exposed protective layer 260 is removed by one or more etching operations, to expose the n-type WFM layers 200 at the regions for the p-type FETs, as shown in FIG. 20E. The plasma etching operation utilizes a gas including $N_2$ and $H_2$, a gas including $O_2/Cl_2$, or $O_2$ gas in some embodiments Subsequently, the n-type WFM layer 200 in the regions for the p-type FETs are removed by an appropriate etching operation, as shown in FIG. 20F. In some embodiments, the etching operation includes a wet etching operation. The etching solution (etchant) includes an aqueous solution of HCl and $H_2O_2$, an aqueous solution of the combination of $N_4OH$ and $H_2O_2$, an aqueous solution of the combination of HCl, $NH_4OH$ and $H_2O_2$, an aqueous solution of HF, $NH_4OH$ and $H_2O_2$ and/or an aqueous solution of $H_3PO_4$ and $H_2O_2$ in some embodiments. The wet etching substantially stops at the first barrier layer 245, which thus functions as an etch stop layer. In some embodiments, the gate dielectric layer 230 acts as an etch stop layer instead of first barrier layer. Because the protective layer 260 is disposed over the first n-type WFM layer 200 at the regions for the n-type FETs, damage to the first n-type WFM layer 200 overlying the n-type FETs from the wet etching operation is prevented.

After the wet etching operation, a wet cleaning operation or a deionized water rinsing is performed in some embodiments. The photoresist layer 205 and the protective layer 260 are removed are subsequently removed, as shown in FIG. 20G. In some embodiments, a plasma ashing operation using an oxygen containing gas is performed to remove the organic photoresist layer 205 and the protective layer 200. In some embodiments, an $N_2/H_2$ based plasma or a $CF_4$ based plasma is used for the plasma ashing operation.

In some embodiments, a third conductive layer, as a second barrier layer 250, is formed over the n-type WFAM layers 200 for the n-type FETs and over the first barrier layer 245 at the regions for the p-type FETs, as shown in FIG. 20H. A blanket layer of the second barrier layer 250 is formed over the regions of the n-type and p-type FETs in some embodiments. In some embodiments, TaN is used as the third conductive layer 250. The thickness of the third conductive layer 250 is in a range from about 0.3 nm to about 30 nm in some embodiments, and is in a range from about 0.5 nm to about 25 nm in other embodiments.

A blanket layer of a first p-type WFM layer 280 is formed over each of the second barrier layers 250 at the regions for the n-type and p-type FETs, as shown in FIG. 20I. In some embodiments, a thickness of the first p-type WFM layers 280 is in a range from about 0.5 nm to about 20 nm, and is in a range from about 1 nm to about 10 nm in other embodiments.

Next, a second patterning operation is performed to remove the first p-type WFM layer 280 from the regions for the first and second n-type FETs N1, N2 and the second and third p-type FETs P2, P3. A second protective layer 265 made of the protective layer compositions disclosed herein with reference to FIGS. 9-12C is formed over each of the first p-type WFM layers 280, the second protective layer 265 is treated to become less hydrophilic or more hydrophobic, as disclosed herein with reference to FIGS. 13-15B, and a second photoresist layer 215 formed of any of the photoresist compositions disclosed herein with reference to FIG. 2 is formed over the second protective layer 265, as shown in FIG. 20J. By using one or more lithography operations, the second photoresist layer 215 is patterned to expose the second protective layer 265 at the regions for the first and second n-type FETs N1, N2 and second and third p-type FETs P2, P3. Then, the exposed second protective layer 265 is removed by one or more plasma etching operations, to expose the first p-type WFM layer 280 at the regions for the first and second n-type FETs N1, N2 and second and third p-type FETs P2, P3, as shown in FIG. 20K. The plasma etching utilize a gas including $N_2$ and $H_2$, a gas including $O_2/Cl_2$, or $O_2$ gas.

Subsequently, the first p-type WFM layer 280 in the regions for the first and second n-type FETs N1, N2 and second and third p-type FETs P2, P3 is removed by an appropriate etching operation, as shown in FIG. 20L. In some embodiments, the etching operation includes a wet etching operation. The etching solution (etchant) includes an aqueous solution of $H_3PO_4$ and $H_2O_2$, an aqueous solution of the combination of HCl, $NH_4OH$ and $H_2O_2$ in some embodiments. The wet etching substantially stops at the second barrier layer 250, which thus functions as an etch stop layer. Because the second protective layer 265 is disposed over the third n-type FET N3 and the first p-type FET P1 damage to the n-type WFM layer 200 overlying the third n-type FET and the first p-type WFM layer 280 from the wet etching operation is prevented.

After the wet etching operation, a wet cleaning operation or a deionized water rinsing is performed in some embodiments. The second photoresist layer 215 and the second protective layer 265 are subsequently removed as shown in FIG. 20M. In some embodiments, a plasma ashing operation using an oxygen containing gas is performed to remove the organic second photoresist layer 215 and second protective layer 265. In some embodiments, an $N_2/H_2$ based plasma or a $CF_4$ based plasma is used for the plasma ashing operation.

A blanket layer of a second p-type WFM layer 285 is formed over the second barrier layer 250 at the regions for the first and second n-type FETs N1, N2 and the second and third p-type FETs P2, P3 and over the first p-type WFM layer 280 at the regions for the third n-type FET N3 and the first p-type FET P1 in some embodiments, as shown in FIG. 20N. In some embodiments, a thickness of the second p-type WFM layers 285 is in a range from about 0.5 nm to about 20 nm, and is in a range from about 1 nm to about 10 nm in other embodiments.

A third patterning operation subsequently is performed to remove the second p-type WFM layer 285 from the regions for the first n-type FET N1 and the third p-type FET P3. In some embodiments, a third protective layer 270 made of the protective layer compositions disclosed herein with reference to FIGS. 9-12C is formed over the second p-type WFM layer 285, the third protective layer 270 is subsequently treated to become less hydrophilic or more hydrophobic, as disclosed herein with reference to FIGS. 13-15B, and a third photoresist layer 225 made of any of the photoresist compositions disclosed herein with reference to FIG. 2 is formed over the third protective layer 270, as shown in FIG. 20O. By using one or more lithography operations, the third photoresist layer 225 is patterned, to expose the third protective layer 270 at the regions for the first n-type FET N1 and the third p-type FET P3. Then, the exposed third protective layer 220 is removed by one or more plasma etching operations, to expose the second p-type WFM layer 285 at the regions for the first n-type FET N1 and the third p-type FET P3, as shown in FIG. 20P. The plasma etching utilizes a gas including $N_2$ and $H_2$, a gas including $O_2/Cl_2$, or $O_2$ gas.

Subsequently, the second p-type WFM layer 285 in the regions for the first n-type FET N1 and the third p-type FET P3 is removed by an appropriate etching operation, as shown in FIG. 20Q. In some embodiments, the etching operation includes a wet etching operation. The etching solution (etchant) includes an aqueous solution of $H_3PO_4$ and $H_2O_2$, an aqueous solution of the combination of HCl, $NH_4OH$, and $H_2O_2$ in some embodiments. The wet etching substantially stops at the second barrier layer 250, which thus functions as an etch stop layer. Because the third protective layer 270 is disposed over the second n-type FET N2, third n-type FET N3, first p-type FET P1, and second p-type FET P2, damage to the n-type WFM layer 200 overlying the second n-type FET N2 and third n-type FET N3, and damage to the second p-type WFM overlying the first p-type FET P1 and second p-type FET P2 from the wet etching operation is prevented.

After the wet etching operation, a wet cleaning operation or a deionized water rinsing is performed in some embodiments. The third photoresist layer 225 and the third protective layer 270 are subsequently removed as shown in FIG. 20R. In some embodiments, a plasma ashing operation using an oxygen containing gas is performed to remove the organic third photoresist layer 225 and the third protective layer 270. In some embodiments, an $N_2/H_2$ based plasma or a $CF_4$ based plasma is used for the plasma ashing operation.

A glue layer 290 is subsequently formed over the second barrier layer 250 at the regions for the first n-type FET N1 and the third p-type FET P3, over the second p-type WFM layer 285 at the regions for the second and third n-type FETs N2, N3 and the first and second p-type FETs P1, P2, and a body gate electrode layer 295 is formed over glue layer 290 in some embodiments to provide the semiconductor device shown in FIG. 14.

In some embodiments, the glue layer 290 is made of TiN, Ti, or Co. In some embodiments, the body gate electrode layer 295 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

Figure 21A:
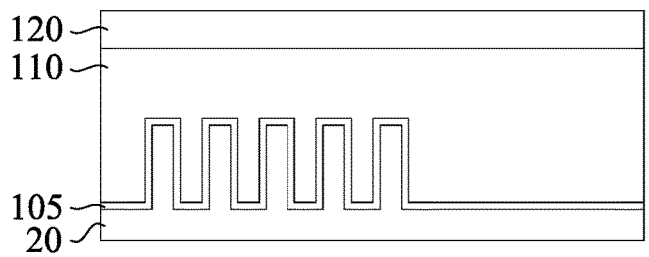
FIGS. 21A, 21B, 21C, 21D, and 21E show a sequential operation according to embodiments of the disclosure.
Figure 21B:
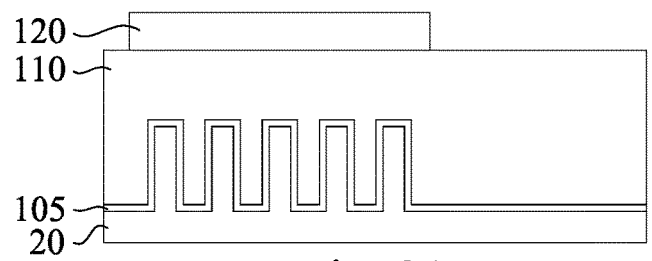
Figure 21C:
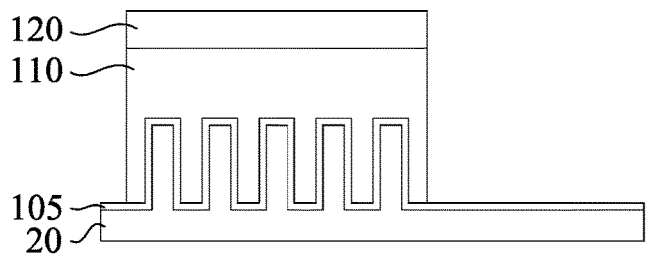
Figure 21D:
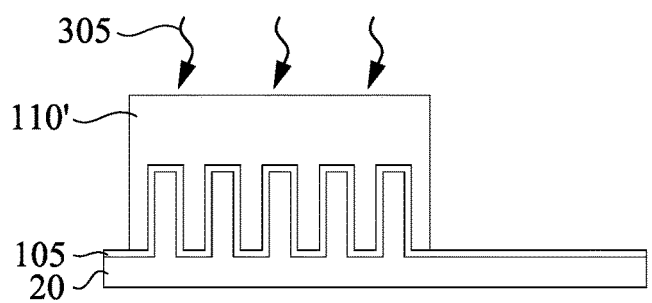
Figure 21E:
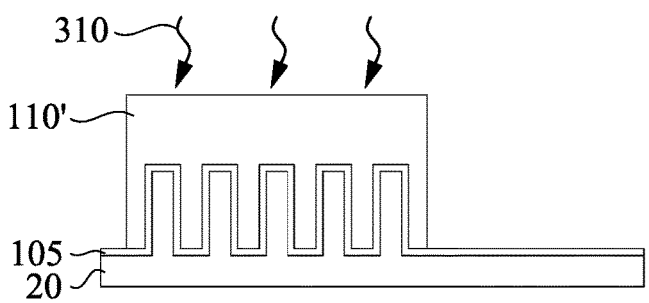

FIGS. 21A-21E show a sequential operation according to embodiments of the disclosure where the protective layer 110 is chemically treated after photoresist patterning and protective layer etching operations. A conductive layer 105 is disposed over a target layer 20, a protective layer 110 is disposed over the conductive layer 105, and a photoresist layer 120 is disposed over the protective layer 110 in some embodiments, as shown in FIG. 21A. The conductive layer 105, protective layer 120, and photoresist layer 120, can be any of the conductive layers, protective layers, and photoresist layers disclosed herein. The photoresist layer 120 is subsequently patterned by photolithographic techniques, as described herein, as shown in FIG. 21B. Then, the pattern in the photoresist layer 120 is extended into the protective layer 110 by etching, as shown FIG. 21C. The etching operation can be wet etching or dry etching. Next, the remaining photoresist layer is removed, and the remaining portion of the protective layer 110 is chemically treated 305 to form a chemically treated protective layer 110', as shown in FIG. 21D. The chemical treatment 305 can be any of the ethylene oxide or propylene oxide treatments described herein. The chemical treatment 305 reduces the hydrophilicity of the protective layer in some embodiments. In some embodiments, the chemical treatment 305 converts a hydrophilic protective layer 110 into a hydrophobic protective layer 110'. A wet cleaning operation 310 is subsequently performed, as shown in FIG. 21E. The wet cleaning operation is performed with any of the cleaning solutions disclosed herein in some embodiments. Deionized water rinsing may be performed after any of the above described operations.

Figure 22:
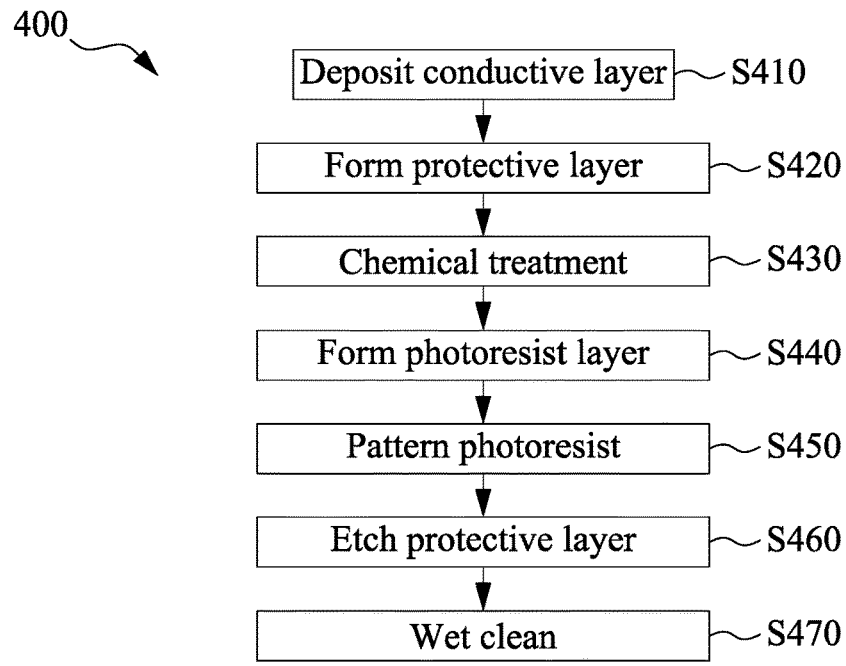
FIG. 22 illustrates a process flow of manufacturing a semiconductor device according to embodiments of the disclosure.

FIG. 22 illustrates a process flow of manufacturing a semiconductor device according to embodiments of the disclosure. In some embodiments, a method 400 of manufacturing a semiconductor device includes an operation S410 of depositing a conductive layer 105, such as a metal layer, over a target layer 20 disposed over a substrate 10. The conductive layer 105 can be any of the metal layers disclosed herein. In operation S420, a protective layer 110 is formed over the conductive layer 105. The protective layer 110 can be any of the protective layers disclosed herein and can be formed by any of the protective layer formation techniques disclosed herein. Next, the protective layer 110 is chemically treated in operation S430 to form a chemically treated protective layer 110'. The chemical treatment S430 can be any of the ethylene oxide or propylene oxide treatments described herein. The chemical treatment S430 reduces the hydrophilicity of the protective layer 110 in some embodiments. In some embodiments, the chemical treatment S430 converts a hydrophilic protective layer 110 into a hydrophobic protective layer 110'. In some embodiments, a photoresist layer 125 is formed over the chemically treated protective layer 110' in operation S440. The photoresist layer 125 can be any of the photoresist layers described herein and can be formed by any of the photoresist forming operations described herein. In some embodiments, the photoresist layer 125 is a trilayer resist, wherein the protective layer 110' is the bottom layer, a silicon-containing inorganic middle layer 115 is formed over the bottom layer 110', and a photoresist layer 120 is formed over the middle layer 115. The photoresist layer 125 is subsequently patterned in operation S450 by photolithographic techniques, as described herein. Then, the pattern in the photoresist layer 125 is extended into the protective layer 110' by etching in operation S460. The etching operation S460 can be wet etching or dry etching. In some embodiments, the etching operation includes etching the silicon-containing middle layer 115. A wet cleaning operation S470 is then performed. The wet cleaning operation S470 is performed with any of the cleaning solutions disclosed herein in some embodiments. Wet cleaning operations or deionized water rinsing may be performed after any of the above described operations.

Figure 23:
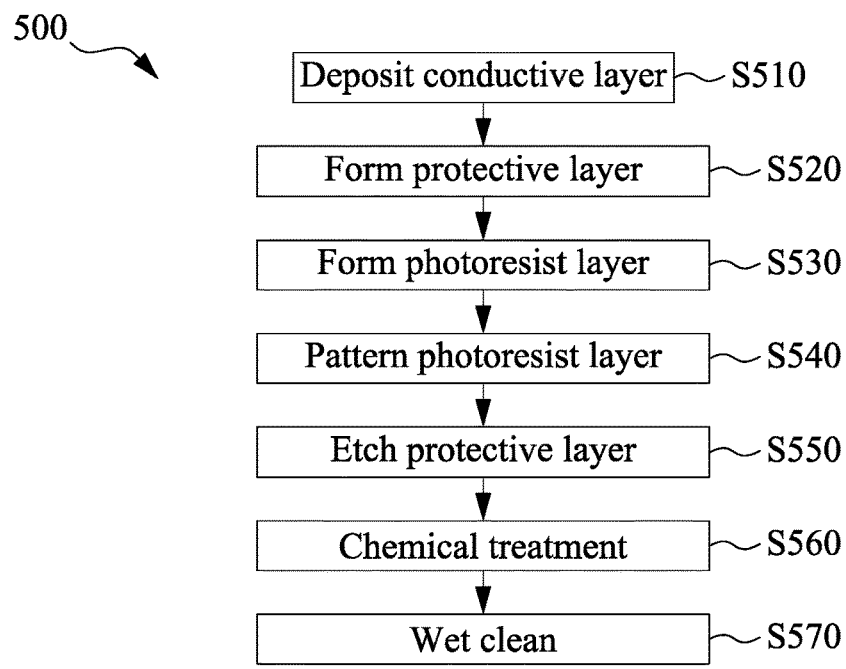
FIG. 23 illustrates a process flow of manufacturing a semiconductor device according to embodiments of the disclosure.

FIG. 23 illustrates a process flow of manufacturing a semiconductor device according to embodiments of the disclosure. In some embodiments, a method 500 of manufacturing a semiconductor device includes an operation S510 of depositing a conductive layer 105, such as a metal layer, over a target layer 20 disposed over a substrate 10. The conductive layer 105 can be any of the metal layers disclosed herein. In operation S520, a protective layer 110 is formed over the conductive layer 105. The protective layer 110 can be any of the protective layers disclosed herein and can be formed by any of the protective layer formation techniques disclosed herein. In some embodiments, a photoresist layer 125 is formed over the protective layer 110 in operation S530. The photoresist layer 125 can be any of the photoresist layers described herein and can be formed by any of the photoresist forming operations described herein. In some embodiments, the photoresist layer 125 is a trilayer resist, wherein the protective layer 110 is the bottom layer, a silicon-containing inorganic middle layer 115 is formed over the bottom layer 110, and a photoresist layer 120 is formed over the middle layer 115. The photoresist layer 125 is subsequently patterned in operation S540 by photolithographic techniques, as described herein. Then, the pattern in the photoresist layer 125 is extended into the protective layer 110' by etching in operation S550. The etching operation S550 can be wet etching or dry etching. In some embodiments, the etching operation includes etching the silicon-containing middle layer 115. Next, the remaining portion of the protective layer 110 is chemically treated in operation S560 to form a chemically treated protective layer 110'. The chemical treatment S560 can be any of the ethylene oxide or propylene oxide treatments described herein. The chemical treatment S560 reduces the hydrophilicity of the protective layer 110 in some embodiments. In some embodiments, the chemical treatment S560 converts a hydrophilic protective layer 110 into a hydrophobic protective layer 110'. In some embodiments, the patterned photoresist layer 125 is removed before the protective layer 110 is chemically treated. A wet cleaning operation S570 is then performed. The wet cleaning operation S570 is performed with any of the cleaning solutions disclosed herein in some embodiments. Wet cleaning operations or deionized water rinsing may be performed after any of the above described operations.

Figure 24:
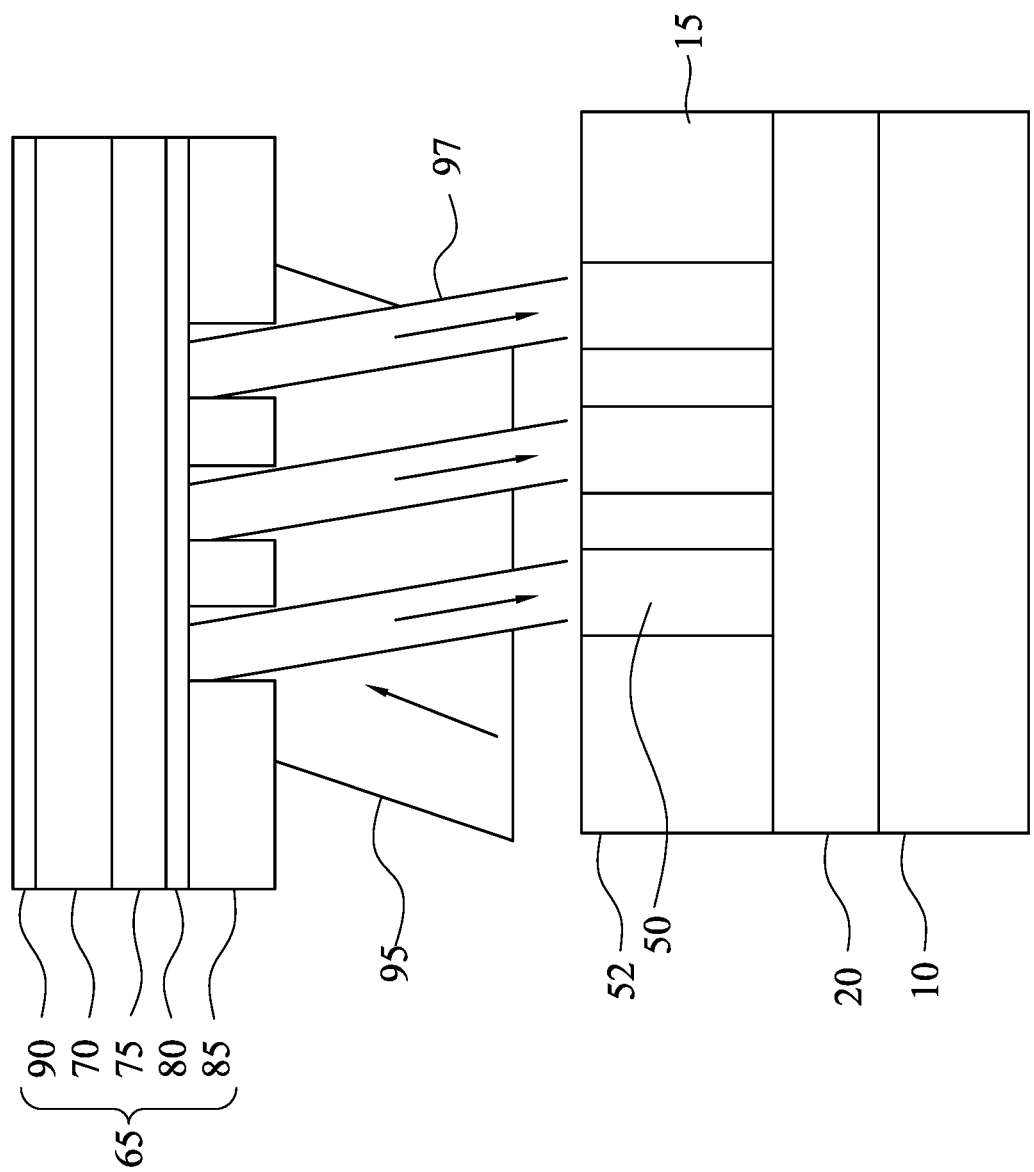
FIG. 24 shows a process stage of a sequential operation according to an embodiment of the disclosure.

In some embodiments, the selective exposure of the photoresist layer 15 (or 125) to form exposed regions 50 and unexposed regions 52 is performed using extreme ultraviolet lithography. In an extreme ultraviolet lithography operation, a reflective photomask 65 is used to form the patterned exposure light in some embodiments, as shown in FIG. 24. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist coated substrate 10, while the portion of the extreme ultraviolet radiation incident upon the absorber layer 85 is absorbed by the photomask. In some embodiments, additional optics, including mirrors, are between the reflective photomask 65 and the photoresist coated substrate.

Other embodiments include other operations before, during, or after the operations described above. In some embodiments, the disclosed methods include forming semiconductor devices, including fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed, according to embodiments of the disclosure.

The novel protective layer compositions and semiconductor device manufacturing methods according to the present disclosure provide higher semiconductor device feature yield. The protective layer of the present disclosure provides improved protection of underlying semiconductor device features from damage and defects caused by wet cleaning and wet etching operations.

An embodiment of the disclosure is a method of manufacturing a semiconductor device, including forming a protective layer over a substrate and reducing hydrophilicity of the protective layer. A resist layer is formed over the protective layer, and the resist layer is patterned. In an embodiment, the substrate has a plurality of protrusions and recesses. In an embodiment, reducing hydrophilicity of the protective layer includes applying a chemical to the protective layer. In an embodiment, the chemical is an ethylene oxide, a propylene oxide, or a combination thereof. In an embodiment, the protective layer is a spin-on carbon layer or a bottom anti-reflection coating layer. In an embodiment, the patterning the resist layer includes selectively exposing the resist layer to actinic radiation to form a latent pattern, and applying a developer to the latent pattern to form a pattern in the resist layer. In an embodiment, the method includes extending the pattern in the resist layer into the protective layer. In an embodiment, the reducing hydrophilicity of the protective layer is performed after the extending the pattern in the resist layer into the protective layer. In an embodiment, the method includes forming a conductive layer over the substrate before forming the protective layer. In an embodiment, the method includes forming a conductive contact over the conductive layer. In an embodiment the conductive layer is a conformal metal layer. In an embodiment, the method includes performing a wet cleaning operation after the reducing the hydrophilicity of the protective layer. In an embodiment, two adjacent protrusions are separated by a gap D1 of less than 20 nm and a depth D2 of the gap from a top surface of the protrusions is greater than 10 nm. In an embodiment, D1/D2 ranges from 0.017 to 2. In an embodiment, the protective layer fills the gaps and extends over the top surface of the protrusions. In an embodiment, the method includes heating the protective layer at a temperature ranging from 100° C. to 400° C. before forming the resist layer. In an embodiment, the method includes heating the protective layer at a temperature ranging from 200° C. to 300° C. before forming the resist layer. In an embodiment, the method includes forming a silicon-containing middle layer over the protective layer before forming the resist layer.

Another method of manufacturing a semiconductor device includes forming a target layer over a substrate. A photoresist underlayer is formed over the target layer, wherein the photoresist underlayer is a hydrophilic layer. The photoresist underlayer is converted from a hydrophilic layer to a hydrophobic layer. A photoresist layer is formed over the photoresist underlayer. The photoresist layer is selectively exposed to actinic radiation. The selectively exposed photoresist layer is developed to form a pattern in the photoresist layer. The substrate is wet cleaned after the developing. In an embodiment, the target layer has a plurality of protrusions and recesses. In an embodiment, the method includes forming a conductive layer over the target layer before forming the photoresist underlayer. In an embodiment, the method includes patterning the conductive layer. In an embodiment, the photoresist underlayer is converted from a hydrophilic layer to a hydrophobic layer after the developing and before the wet cleaning. In an embodiment, the photoresist underlayer is converted from a hydrophilic layer to a hydrophobic layer by applying an ethylene oxide, a propylene oxide, or a combination thereof to the hydrophilic layer. In an embodiment, the photoresist underlayer is a spin-on carbon layer or a bottom anti-reflection coating layer. In an embodiment, the method includes extending the pattern in the photoresist layer into the photoresist underlayer and into the conductive layer. In an embodiment, the method includes forming a conductive contact over the conductive layer. In an embodiment the conductive layer is a conformal metal layer. In an embodiment, the method includes heating the protective layer at a temperature ranging from 100° C. to 400° C. before forming the resist layer. In an embodiment, the method includes heating the photoresist underlayer at a temperature ranging from 200° C. to 300° C. before forming the photoresist layer. In an embodiment, the method includes forming a silicon-containing middle layer over the protective layer before forming the photoresist layer.

Another embodiment of the disclosure is a method of manufacturing a semiconductor device, including forming a spin on carbon layer comprising a spin on carbon composition over a substrate having a topography including a plurality of spaced-apart protrusions having upper surfaces. An ethylene oxide or a propylene oxide is applied to the spin on carbon layer. A photoresist layer is formed over the spin on carbon layer. The photoresist layer is patternwise imaged, and the photoresist layer is developed to form a pattern in the photoresist layer. In an embodiment, the ethylene oxide or propylene oxide are one or more selected from the group consisting of

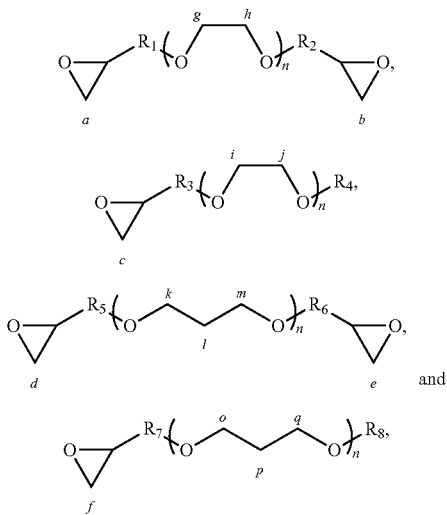

where a, b, c, d, e, and f are each independently H or a methyl group; g, h, i, j, k, l, m, o, p, and q are each independently H, a carbonyl group, of a C1-C5 alkyl group; R1, R2, R3, R4, R5, R6, R7, and R8 are each independently a C1-C10 alkyl group; and n is 1 to 100. In an embodiment, the ethylene oxide or propylene oxide are one or more selected from the group consisting of

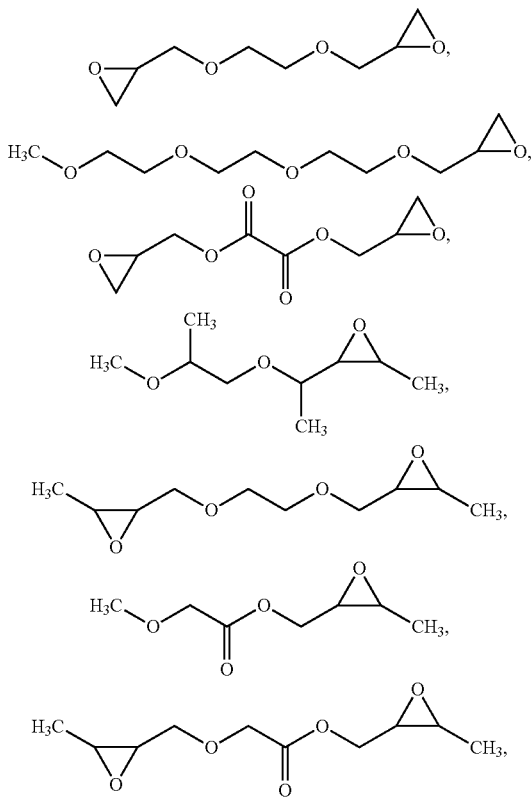

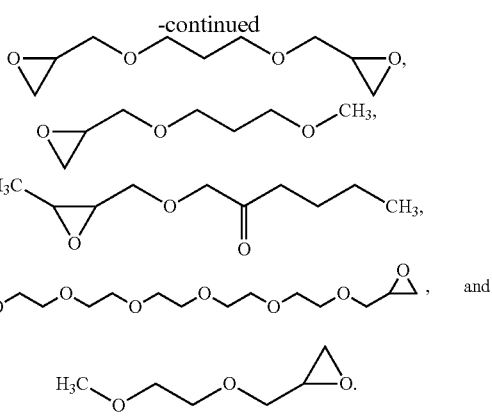

In an embodiment, the method includes forming a conductive layer over the spin on carbon layer before forming the photoresist layer. In an embodiment, the method includes heating the spin on carbon layer at a temperature ranging from 100° C. to 400° C. before forming the photoresist layer. In an embodiment, the method includes heating the spin on carbon layer at a temperature ranging from 200° C. to 300° C. before forming the photoresist layer. In an embodiment, the method includes forming a target layer over the substrate, wherein the target layer has a plurality of protruding features. In an embodiment, the conductive layer is formed over the protruding features. In an embodiment, the method includes extending the pattern in the photoresist layer into the spin on carbon layer, exposing the conductive layer. In an embodiment, the method includes forming a conductive contact over the conductive layer. In an embodiment the conductive layer is a conformal metal layer. In an embodiment, the method includes forming a silicon-containing middle layer over the spin on carbon layer before forming the photoresist layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a protective layer over a substrate;
   reducing hydrophilicity of the protective layer by applying a chemical selected from an ethylene oxide, a propylene oxide, or a combination thereof;
   forming a resist layer over the protective layer; and
   patterning the resist layer,
   wherein the ethylene oxide or propylene oxide are one or more selected from the group consisting of

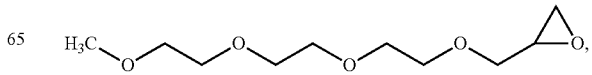

-continued

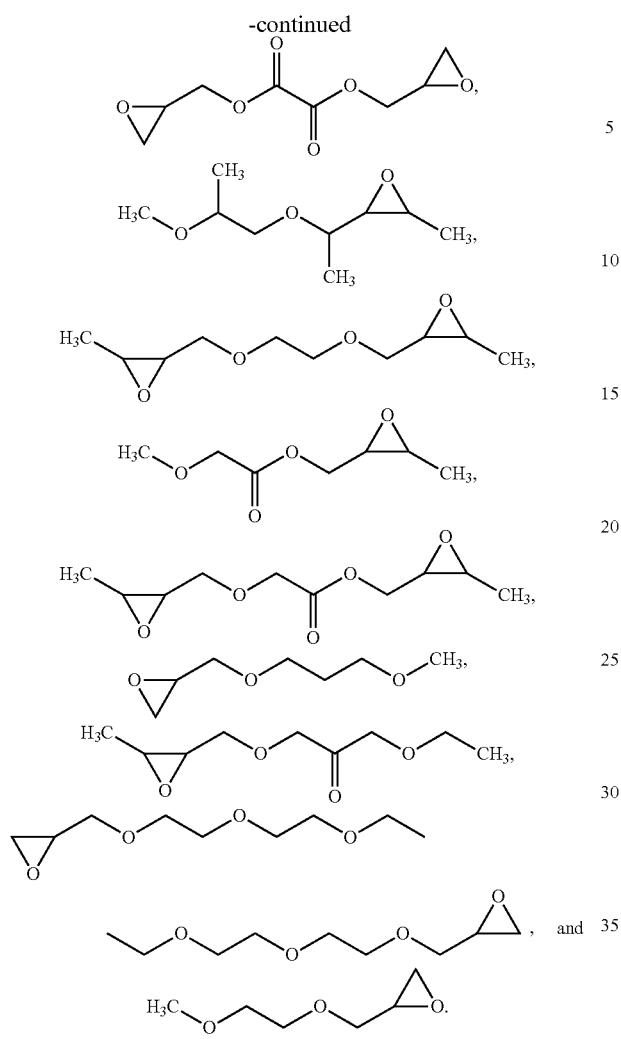

2. The method according to claim 1, wherein the substrate has a plurality of protrusions and recesses.

3. The method according to claim 1, wherein the protective layer is a spin-on carbon layer or a bottom anti-reflection coating layer.

4. The method according to claim 1, wherein the patterning the resist layer comprises:
selectively exposing the resist layer to actinic radiation to form a latent pattern; and
applying a developer to the latent pattern to form a pattern in the resist layer.

5. The method according to claim 4, further comprising extending the pattern in the resist layer into the protective layer.

6. The method according to claim 5, wherein the reducing hydrophilicity of the protective layer is performed after the extending the pattern in the resist layer into the protective layer.

7. The method according to claim 1, further comprising forming a conductive layer over the substrate before forming the protective layer.

8. The method according to claim 1, further comprising performing a wet cleaning operation after the reducing the hydrophilicity of the protective layer.

9. A method of manufacturing a semiconductor device, comprising:
forming a target layer over a substrate;
forming a photoresist underlayer over the target layer, wherein the photoresist underlayer is a hydrophilic layer;
converting the photoresist underlayer from the hydrophilic layer to a hydrophobic layer by applying a chemical selected from an ethylene oxide, a propylene oxide, or a combination thereof;
forming a photoresist layer over the photoresist underlayer;
selectively exposing the photoresist layer to actinic radiation;
developing the selectively exposed photoresist layer to form a pattern in the photoresist layer; and
wet cleaning the substrate after the developing,
wherein the ethylene oxide or propylene oxide are one or more selected from the group consisting of

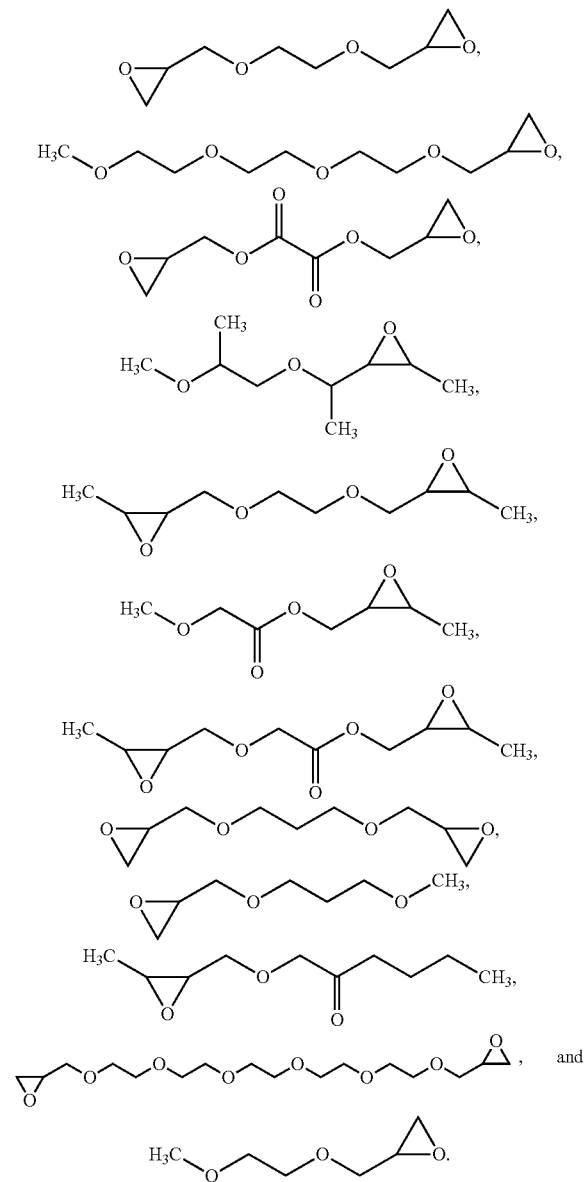

10. The method according to claim 9, wherein the target layer has a plurality of protrusions and recesses.

11. The method according to claim 9, further comprising forming a conductive layer over the target layer before forming the photoresist underlayer.

12. The method according to claim 11, further comprising patterning the conductive layer.

13. The method according to claim 9, wherein the photoresist underlayer is converted from a hydrophilic layer to a hydrophobic layer after the developing and before the wet cleaning.

14. A method of manufacturing a semiconductor device, comprising:
forming a spin on carbon layer comprising a spin on carbon composition over a substrate having a topography including a plurality of spaced-apart protrusions having upper surfaces,
applying an ethylene oxide or a propylene oxide to the spin on carbon layer;
forming a photoresist layer over the spin on carbon layer;
patternwise imaging the photoresist layer; and
developing the photoresist layer to form a pattern in the photoresist layer,
wherein the ethylene oxide or the propylene oxide are one or more selected from the group consisting of

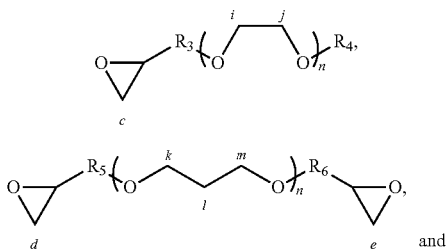

and

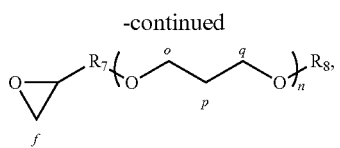

where a, b, c, d, e, and f are each independently H or a methyl group; g, h, i, j, k, l, m, o, p, and q are each independently hydrogen, a carbonyl group, or a C1-C5 alkyl group; R1, R2, R3, R4, R5, R6, R7, and R8 are each independently a C1-C10 alkyl group; w is 3 to 100; and n is 1 to 100.

15. The method according to claim 14, further comprising forming a conductive layer over the spin on carbon layer before forming the photoresist layer.

16. The method according to claim 14, further comprising heating the spin on carbon layer at a temperature ranging from 100° C. to 400° C. before forming the photoresist layer.

17. The method according to claim 9, further comprising forming a conductive layer over the substrate before forming the photoresist underlayer.

18. The method according to claim 9, further comprising performing a wet cleaning operation after the reducing the hydrophilicity of the photoresist underlayer.

19. The method according to claim 14, further comprising heating the spin on carbon layer at a temperature ranging from 100° C. to 300° C. before forming the photoresist layer.

20. The method according to claim 14, further comprising performing a wet cleaning operation after the applying the ethylene oxide or the propylene oxide to the spin on carbon layer.

* * * * *